(12) United States Patent
Cho

(10) Patent No.: US 11,296,148 B2
(45) Date of Patent: Apr. 5, 2022

(54) VARIABLE RESISTANCE MEMORY DEVICES

(71) Applicant: SAMSUNG ELECTRONICS CO., LTD., Suwon-si (KR)

(72) Inventor: Junghyun Cho, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 17/027,992

(22) Filed: Sep. 22, 2020

(65) Prior Publication Data

US 2021/0183950 A1 Jun. 17, 2021

(30) Foreign Application Priority Data

Dec. 17, 2019 (KR) .......................... 10-2019-0168823

(51) Int. Cl.
*H01L 27/24* (2006.01)
*H01L 45/00* (2006.01)
*H01L 23/522* (2006.01)
*H01L 23/532* (2006.01)
*H01L 23/535* (2006.01)

(52) U.S. Cl.
CPC ...... *H01L 27/2481* (2013.01); *H01L 23/5226* (2013.01); *H01L 23/535* (2013.01); *H01L 23/53228* (2013.01); *H01L 23/53257* (2013.01); *H01L 27/2427* (2013.01); *H01L 27/2436* (2013.01); *H01L 45/06* (2013.01); *H01L 45/08* (2013.01); *H01L 45/144* (2013.01); *H01L 45/146* (2013.01); *H01L 45/147* (2013.01); *H01L 45/16* (2013.01)

(58) Field of Classification Search
CPC ............ H01L 27/2481; H01L 27/2427; H01L 27/2436; H01L 23/5226; H01L 23/53228; H01L 23/53257; H01L 23/535; H01L 45/06; H01L 45/08; H01L 45/144; H01L 45/146; H01L 45/147; H01L 45/16
USPC .......................................................... 257/5
See application file for complete search history.

(56) References Cited

U.S. PATENT DOCUMENTS

| | | |
|---|---|---|
| 6,917,532 B2 | 7/2005 | Van Brocklin et al. |
| 8,183,602 B2 | 5/2012 | Tabata et al. |
| 8,355,281 B2 | 1/2013 | Grossi et al. |

(Continued)

*Primary Examiner* — Tu-Tu V Ho
(74) *Attorney, Agent, or Firm* — Lee IP Law, P.C.

(57) ABSTRACT

A variable resistance memory device including a substrate; first and second transistors on the substrate; first conductive lines on the transistors, each of the first conductive lines extending in a first direction, and the first conductive lines being spaced apart from each other; first contact plugs directly contacting substrate-facing surfaces of the first conductive lines, the first contact plugs being electrically connected to the first transistors, respectively; second conductive lines on the first conductive lines, each of the second conductive lines extending in the second direction, and the second conductive lines being spaced apart from each other; second contact plugs directly contacting substrate-facing surfaces of the second conductive lines, the second contact plugs being electrically connected to the second transistors, respectively; and memory units between the conductive lines, wherein each of the second contact plugs does not overlap with any of the memory units in the third direction.

20 Claims, 29 Drawing Sheets

(56) References Cited

U.S. PATENT DOCUMENTS

| | | | |
|---|---|---|---|
| 8,404,578 B2 * | 3/2013 | Kim | H01L 27/11568 |
| | | | 438/599 |
| 8,536,048 B2 | 9/2013 | Nansei | |
| 9,252,097 B2 | 2/2016 | Baba | |
| 10,056,120 B2 | 8/2018 | Castro et al. | |
| 2009/0267047 A1 | 10/2009 | Sasago et al. | |

* cited by examiner

VARIABLE RESISTANCE MEMORY DEVICES

CROSS-REFERENCE TO RELATED APPLICATION

Korean Patent Application No. 10-2019-0168823, filed on Dec. 17, 2019, in the Korean Intellectual Property Office, and entitled: "Variable Resistance Memory Devices," is incorporated by reference herein in its entirety.

BACKGROUND

1. Field

Embodiments relate to a variable resistance memory device.

2. Description of the Related Art

In order to increase the integration degree of a variable resistance memory device having a cell over periphery (COP) structure, contact plugs, which may be electrically connected to transistors through a peripheral circuit region, contacting word lines and bit lines may have a small size.

SUMMARY

The embodiments may be realized by providing a variable resistance memory device including a substrate including a cell region and a peripheral circuit region surrounding the cell region; first transistors and second transistors on the cell region of the substrate; first conductive lines on the first and second transistors on the cell region of the substrate, each of the first conductive lines extending in a first direction parallel to an upper surface of the substrate, and the first conductive lines being spaced apart from each other in a second direction parallel to the upper surface of the substrate and crossing the first direction; first contact plugs directly contacting substrate-facing surfaces of the first conductive lines and extending in a third direction perpendicular to the upper surface of the substrate, the first contact plugs being electrically connected to the first transistors, respectively; second conductive lines on the first conductive lines on the cell region of the substrate, each of the second conductive lines extending in the second direction, and the second conductive lines being spaced apart from each other in the first direction; second contact plugs directly contacting substrate-facing surfaces of the second conductive lines and extending in the third direction, the second contact plugs being electrically connected to the second transistors, respectively; and memory units between the first and second conductive lines, the memory units being at an area where the first and second conductive lines overlap each other in the third direction, wherein each of the second contact plugs does not overlap with any of the memory units in the third direction.

The embodiments may be realized by providing a variable resistance memory device including a substrate including a cell region and a peripheral circuit region surrounding the cell region; transistors on the cell region of the substrate; first to fourth conductive lines spaced apart from each other in a vertical direction on the cell region of the substrate, the vertical direction being perpendicular to an upper surface of the substrate; first to fourth contact plugs contacting substrate-facing surfaces of the first to fourth conductive lines, respectively, each of the first to fourth contact plugs extending in the vertical direction, and the first to fourth contact plugs being electrically connected to corresponding ones of the transistors, respectively; first memory units between the first and second conductive lines, the first memory units being at an area where the first and second conductive lines overlap each other in the vertical direction, each of the first memory units including a first variable resistance pattern; second memory units between the second and third conductive lines, the second memory units being at an area where the second and third conductive lines overlap each other in the vertical direction, each of the second memory units including a second variable resistance pattern; and third memory units between the third and fourth conductive lines, the third memory units being at an area where the third and fourth conductive lines overlap each other in the vertical direction, each of the third memory units including a third variable resistance pattern, wherein each of the first and third conductive lines extends in a first direction parallel to the upper surface of the substrate, the first and third conductive lines being spaced apart from each other in a second direction parallel to the upper surface of the substrate and crossing the first direction, and the first conductive lines not overlapping the third conductive lines in the vertical direction, each of the second and fourth conductive lines extends in the second direction, the second and fourth conductive lines being spaced apart from each other in the first direction, and the second conductive lines not overlapping the fourth conductive lines in the vertical direction, and each of the second contact plugs does not overlap any of the first memory units in the vertical direction.

The embodiments may be realized by providing a variable resistance memory device including a substrate including a cell region and a peripheral circuit region surrounding the cell region; first transistors on the cell region of the substrate; a second transistor on the peripheral circuit region of the substrate; first to fourth conductive lines spaced apart from each other in a vertical direction on the cell region of the substrate, the vertical direction being perpendicular to an upper surface of the substrate; an upper wiring on the fourth conductive lines on the cell region and the peripheral circuit region of the substrate; first to fourth contact plugs contacting substrate-facing surfaces of the first to fourth conductive lines, respectively, the first to fourth contact plugs being electrically connected to corresponding ones of the transistors, respectively; a conductive structure between the second transistor and the upper wiring, the conductive structure being electrically connected to the second transistor and the upper wiring; first memory units between the first and second conductive lines, the first memory units being at an area where the first and second conductive lines overlap each other in the vertical direction, each of the first memory units including a first variable resistance pattern; second memory units between the second and third conductive lines, the second memory units being at an area where the second and third conductive lines overlap each other in the vertical direction, each of the second memory units including a second variable resistance pattern; and third memory units between the third and fourth conductive lines, the third memory units being at an area where the third and fourth conductive lines overlap each other in the vertical direction, each of the third memory units including a third variable resistance pattern, wherein each of the first and third conductive lines extends in a first direction parallel to the upper surface of the substrate, the first and third conductive lines being respectively spaced apart from each other in a second direction parallel to the upper surface of the substrate and crossing the first direction, and the first conductive lines not overlapping the third conductive lines in the vertical direction, each of the second and fourth conductive lines extends in the second direction, the second and fourth conductive lines being respectively spaced apart from each other in the first direction, and the second conductive lines not overlapping the fourth conductive lines in the vertical direction, and each of the second contact plugs does not overlap any of the first memory units in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
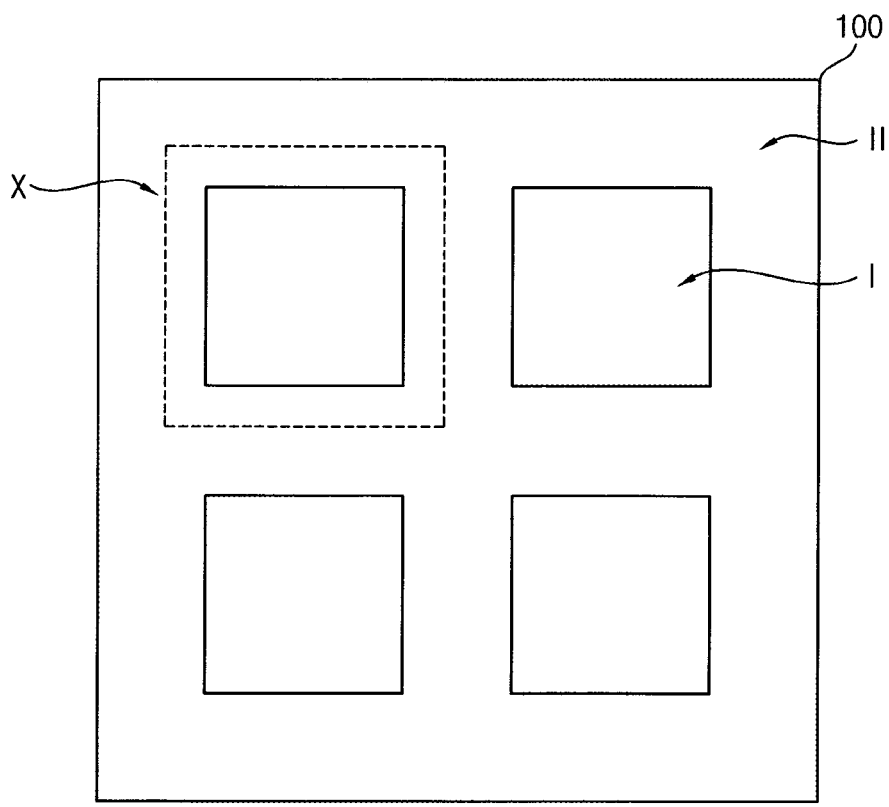
FIGS. 1 to 4 are plan views and cross-sectional views of a variable resistance memory device in accordance with example embodiments.
Figure 2:
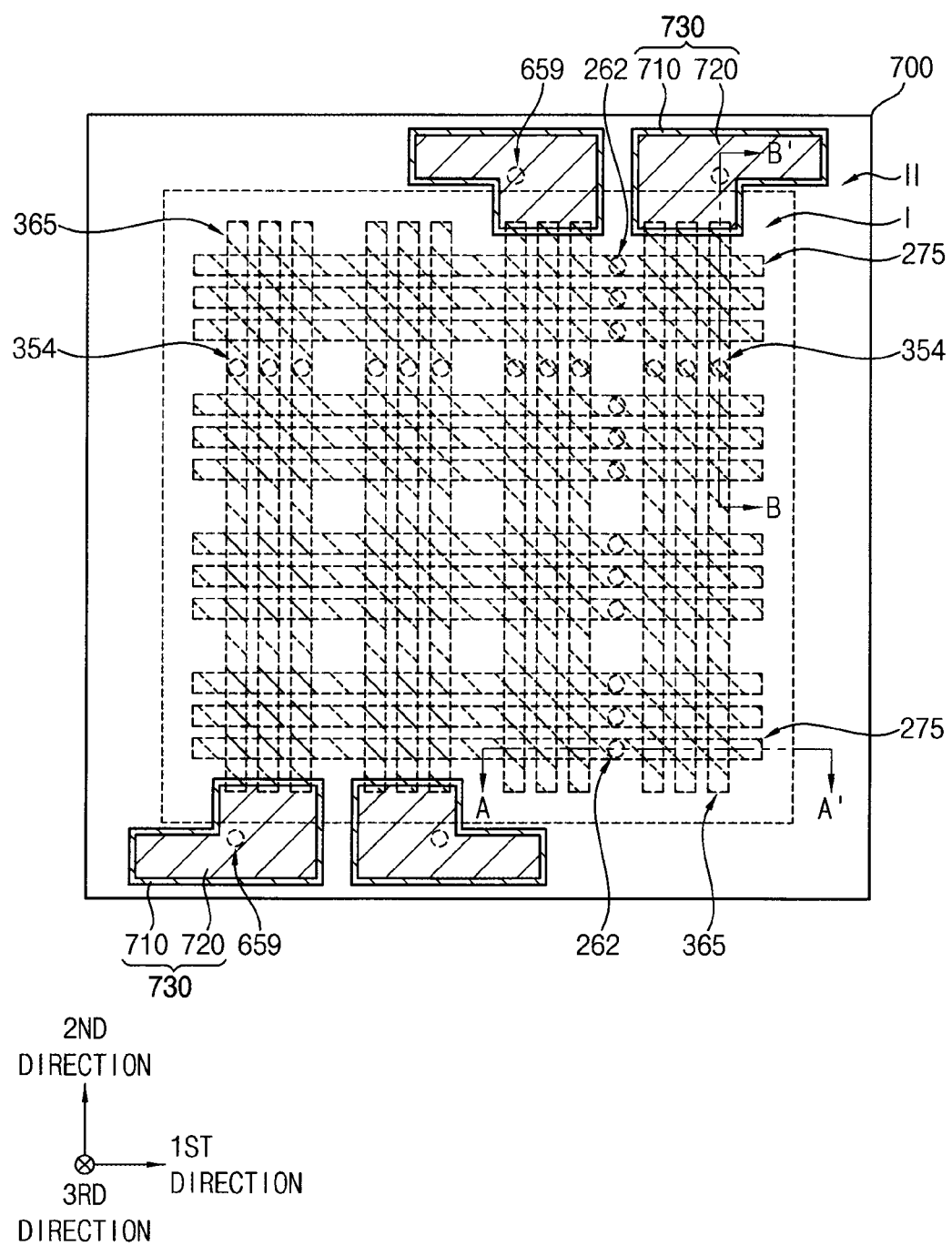
Figure 3:
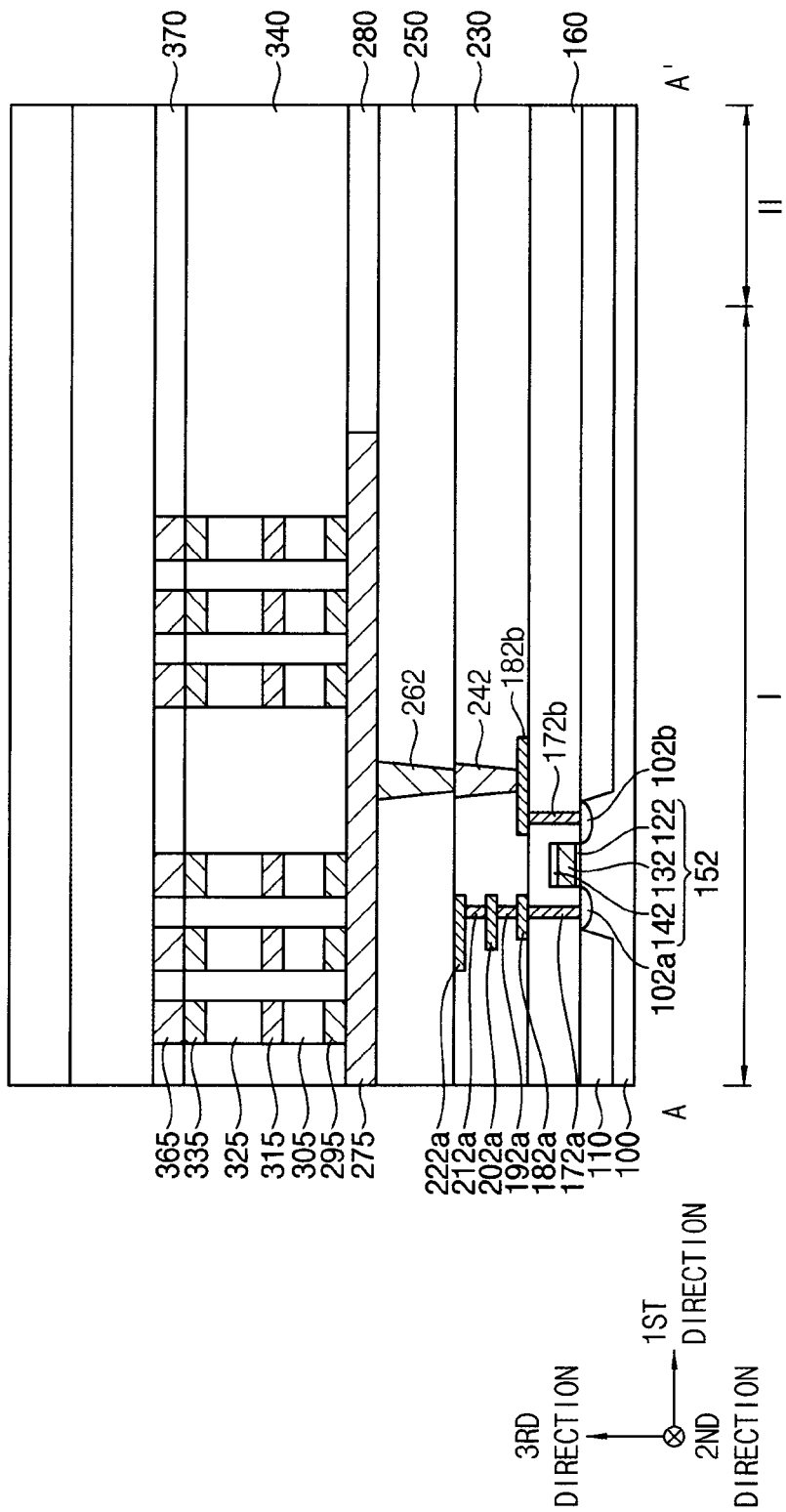
Figure 4:
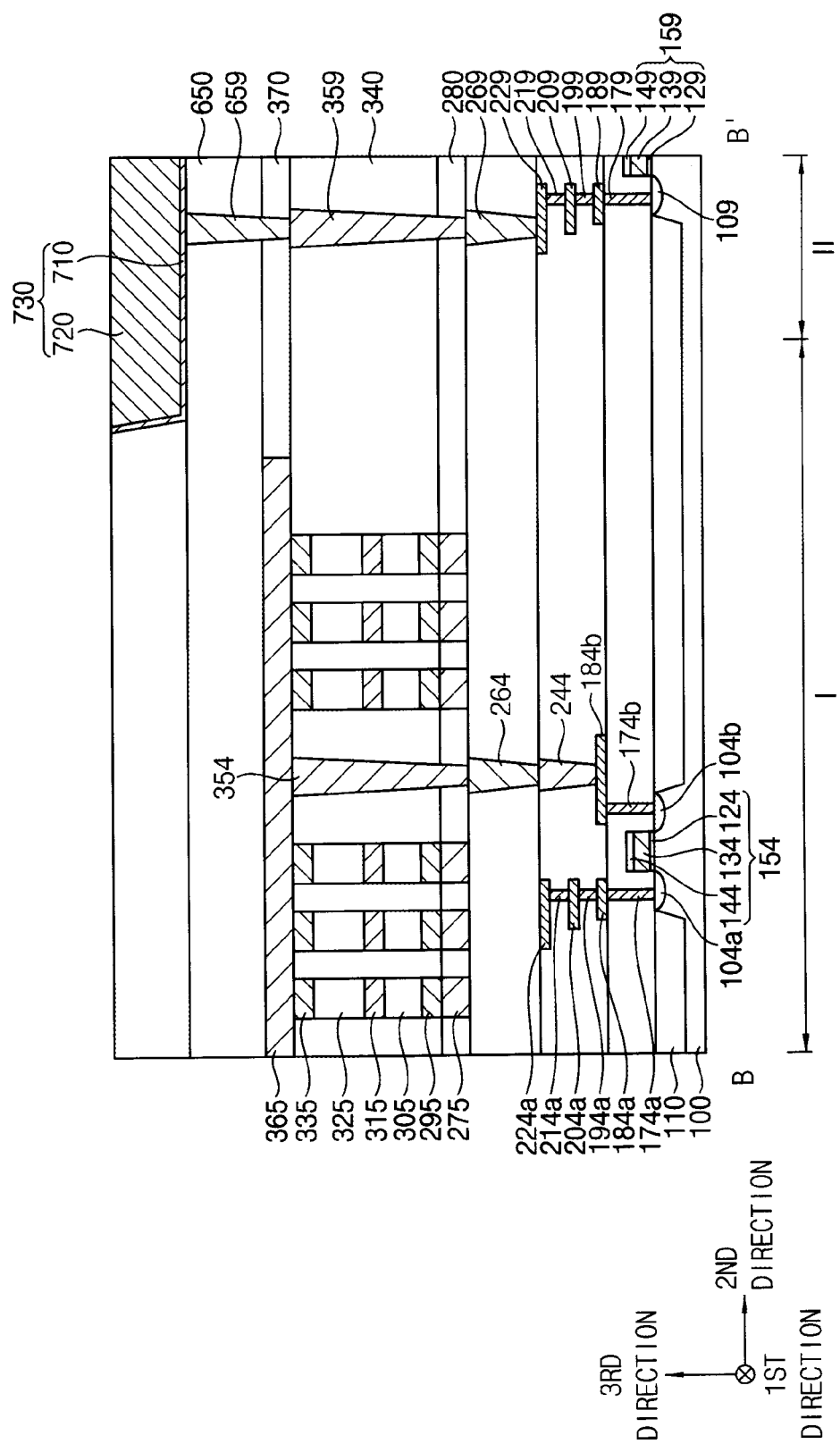

FIGS. 1 to 4 are plan views and cross-sectional views of a variable resistance memory device in accordance with example embodiments. FIGS. 1 and 2 are the plan views, and FIGS. 3 and 4 are the cross-sectional views.

FIG. 1 is a plan view of a first region and a second region of a substrate, FIG. 2 is an enlarged plan view of a region X of FIG. 1, FIG. 3 is a cross-sectional view taken along a line A-A' of FIG. 2, and FIG. 4 is a cross-sectional view taken along a line B-B' of FIG. 2.

Hereinafter in the specifications (and not necessarily in the claims), two directions intersecting with each other among horizontal directions substantially parallel to an upper surface of a substrate are defined as first and second directions, respectively, and a vertical direction substantially perpendicular to the upper surface of the substrate is defined as a third direction. In an implementation, the first and second directions may be orthogonal to each other.

Referring to FIG. 1, the variable resistance memory device may be formed on a substrate 100 including first and second regions I and II.

The substrate 100 may include a semiconductor material, e.g., silicon, germanium, silicon-germanium, etc., or a III-V compound, e.g., GaP, GaAs, GaSb, etc. In some embodiments, the substrate 100 may be a silicon-on-insulator (SOI) substrate or a germanium-on-insulator (GOI) substrate.

In an implementation, the first region I of the substrate 100 may be a cell region in which memory cells may be formed, and the second region II of the substrate 100 may be a peripheral circuit region in which, e.g., row decoders, page buffers, column decoders, driving circuits, etc., may be formed.

The first region I may be defined by a portion of the substrate 100 on which first to fourth conductive lines are formed, and the second region II may be defined by a portion of the substrate 100 on which no one of the first to fourth conductive lines is formed.

In an implementation, a plurality of first regions I may be spaced apart from each other in each of the first and second directions, and may be surrounded by the second region II.

Hereinafter, each of the first and second regions I and II of the substrate 100 may include not only a portion of the substrate 100 but also a space over and under the portion of the substrate 100.

Referring to FIGS. 2 and 3, the variable resistance memory device may include first and second transistors on the first region I of the substrate 100, a third transistor on the second region II of the substrate 100, first and second conductive lines 275 and 365 (spaced apart from each other in the third direction on the first region I of the substrate 100), an upper wiring 730 (on the second conductive lines 365 on the first and second regions I and II of the substrate 100), first to third contact plugs 262, 264 and 354 (contacting bottom surfaces of the first and second conductive lines 275 and 365 and extending in the third direction to be electrically connected to corresponding ones, respectively, of the first and second transistors), a conductive structure between the third transistor and the upper wiring 730 and electrically connected thereto, and a first electrode 295, a first selection pattern 305, and a first memory unit sequentially stacked between the first and second conductive lines 275 and 365 at an area in which the first and second conductive lines 275 and 365 overlap each other in the third direction.

The first transistor may include a first lower gate structure 152 and first and second impurity regions 102a and 102b at upper portions of the active region 105 adjacent thereto, the second transistor may include a second lower gate structure 154 and third and fourth impurity regions 104a and 104b at upper portions of the active region 105 adjacent thereto, and the third transistor may include a third lower gate structure 159 and a fifth impurity region 109 at an upper portion of the active region 105 adjacent thereto. A lower contact plug, a lower wiring, a lower via, or the like, may be further formed on each of the first to fifth impurity regions 102a, 102b, 104a, 104b and 109.

The first conductive line 275 may include a first barrier line and a first metal line sequentially stacked. The first barrier line may include a metal nitride or a metal silicon nitride, e.g., titanium nitride, titanium silicon nitride, tungsten nitride, tungsten silicon nitride, tantalum nitride, tantalum silicon nitride, or the like, and the first metal line may include, e.g., tungsten, platinum, copper, aluminum, titanium, tantalum, or the like.

In an implementation, the first conductive line 275 may extend in the first direction, and a plurality of first conductive lines 275 may be spaced apart from each other in the second direction.

Some of the plurality of first conductive lines 275 spaced apart from each other in the second direction may form a first conductive line structure. In an implementation, as illustrated in FIG. 2, the first conductive line structure may include three first conductive lines 275. In an implementation, as illustrated in FIG. 2, four first conductive line structures may be spaced apart from each other in the second direction on the first region I of the substrate 100.

A first lower contact plug 242 and the first contact plug 262 may be sequentially stacked between the first conductive line 275 and the first transistor on the first region I of the substrate 100, and the first conductive line 275 and the first transistor may be electrically connected with each other by the first lower contact plug 242 and the first contact plug 262.

In an implementation, the first lower contact plug 242 may include copper, and the first contact plug 262 may include tungsten. In an implementation, the first lower contact plug 242 and the first contact plug 262 may include the same material, e.g., tungsten or copper.

The second conductive line 365 may include a second barrier line and a second metal line sequentially stacked, which may include the same materials as the first barrier line and the first metal line, respectively.

In an implementation, the second conductive line 365 may extend in the second direction, and a plurality of second conductive lines 365 may be spaced apart from each other in the first direction.

Some of the plurality of second conductive lines 365 spaced apart from each other in the first direction may form a second conductive line structure. In an implementation, three second conductive lines 365 may form one second conductive line structure, and a plurality of second conductive line structures may be spaced apart from each other in the first direction.

A second lower contact plug 244 and the second and third contact plugs 264 and 354 may be sequentially stacked between the second conductive line 365 and the second transistor on the first region I of the substrate 100, which may be electrically connected with each other by the second lower contact plug 244 and the second and third contact plugs 264 and 354.

In an implementation, the second lower contact plug 244 may include copper, and each of the second and third contact plugs 264 and 354 may include tungsten. In an implementation, the second lower contact plug 244 and the second and third contact plugs 264 and 354 may include the same material, e.g., tungsten. In an implementation, each of the second lower contact plug 244 and the second contact plug 264 may include copper, and the third contact plug 354 between the first memory units may include tungsten.

In an implementation, a first structure including the first lower contact plug 242 and the first contact plug 262 sequentially stacked may be under (e.g., aligned in the third direction with) a space between adjacent (e.g., in the first direction) ones of the second conductive line structures, and a plurality of first structures may be spaced apart from each other in the second direction.

In an implementation, a second structure including the second lower contact plug 244 and the second and third contact plugs 264 and 354 sequentially stacked may be under, over, or in a space between adjacent (e.g., in the second direction) ones of the first conductive line structures, and a plurality of second structures may be spaced apart from each other in the first direction.

In an implementation, the third contact plug 354 may not overlap any one of the first memory units in the third direction, and may extend from a bottom surface (e.g., substrate 100-facing surface) of the second conductive line 365 to at least a level at which a bottom surface of the first conductive line 275 is formed (e.g., a lower end of the third contact plug 354 may be coplanar or otherwise aligned with the bottom surface of the first conductive line 275).

The first electrode 295, the first selection pattern 305, and the first memory unit may be sequentially stacked between the first and second conductive line structures at an area in which the first and second conductive lines 275 and 365 overlap each other in the third direction, which may form a first memory cell.

The first electrode 295 may include a metal nitride, e.g., titanium nitride, tungsten nitride, tantalum nitride, or the like, or a metal silicon nitride, e.g., titanium silicon nitride, and may be referred to as a lower electrode of the variable resistance memory device.

The first selection pattern 305 may include an OTS material, which may serve as a switching function due to a resistance difference depending on an applied voltage while maintaining an amorphous state.

The OTS material may include, e.g., germanium (Ge), silicon (Si), arsenic (As) and/or tellurium (Te), and may further include selenium (Se), sulfur (S), carbon (C), nitrogen (N), indium (In), boron (B), or the like.

The OTS material may include, e.g., AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}S_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, or the like.

The first memory unit may include a second electrode 315, a first variable resistance pattern 325, and a third electrode 335 sequentially stacked.

The first variable resistance pattern 325 may include a phase change material of which a resistance may change according to the phase thereof. In an implementation, the first variable resistance pattern 325 may include a chalcogenide material in which germanium (Ge), antimony (Sb) and/or tellurium (Te) may be combined in a given ratio. In an implementation, the first variable resistance pattern 325 may include a super lattice in which germanium-tellurium (GeTe) and antimony-tellurium (SbTe) may be repeatedly stacked. In an implementation, the variable resistance layer 260 may include IST containing indium-antimony-tellurium, or BST containing bismuth-antimony-tellurium. The first variable resistance pattern 325 may further include carbon (C), nitride (N), boron (B), oxygen (O), or the like.

In an implementation, the first variable resistance pattern 325 may include a perovskite material or a transition metal oxide. The perovskite material may include, e.g., STO ($SrTiO_3$), BTO ($BaTiO_3$), PCMO ($Pr_{1-x}Ca_xMnO_3$), or the like. The transition metal oxide may include, e.g., titanium oxide ($TiO_x$), zirconium oxide ($ZrO_x$), aluminum oxide ($AlO_x$), hafnium oxide ($HfO_x$), or the like. These may be used alone or in a combination thereof.

The second and third electrodes 315 and 335 may include a metal nitride, e.g., titanium nitride, tungsten nitride, tantalum nitride, or the like, and may be referred to as middle and upper electrodes, respectively.

The plurality of first conductive lines 275 may be spaced apart from each other in the second direction and the plurality of second conductive lines 365 may be spaced apart from each other in the first direction, and a plurality of first memory cells each including the first electrode 295, the first selection pattern 305 and the first memory unit sequentially stacked may be spaced apart from each other in each of the first and second directions.

In an implementation, the plurality of first conductive line structures may be spaced apart from each other in the second direction and the plurality of second conductive line structures may be spaced apart from each other in the first direction, and some of the first memory cells may be spaced apart from each other by a distance greater than a distance of other ones of the first memory cells. Some of the first memory cells may form a first cell array.

In an implementation, as illustrated in FIG. 2, the first cell array may include nine memory cells. In an implementation, the number of the memory cells included in one cell array may be changed depending on the number of the first conductive lines 275 included in the first conductive line structure and the number of the second conductive lines 365 included in the second conductive line structure.

The conductive structure on the second region II of the substrate 100 may include first to third conductive patterns 269, 359 and 659, which may include not tungsten but copper.

The variable resistance memory device may further include first to eighth insulating interlayers 160, 230, 250, 280, 340, 370, 650 and 700, which may include a nitride, e.g., silicon nitride, or an oxide, e.g., silicon oxide.

As described above, the third contact plug 354 (directly contacting the second conductive line 365 among the contact plugs on the first region I of the substrate 100) may not include copper and may include tungsten. An electromigration (EM) phenomenon or an increase of bias temperature stress (BTS) may not occur in a structure including tungsten, even if it has a small size, and the third contact plug 354 including tungsten may have a reduced size.

In an implementation, the third contact plug 354 may extend (e.g., lengthwise) on the first region I of the substrate 100 through the fifth insulating interlayer 340 in the third direction (between the first memory units), and may directly extend in the third direction on the first region I to be electrically connected to the first transistor without passing through the second region II of the substrate 100.

FIGS. 5 to 15 are plan views and cross-sectional views of stages in a method of manufacturing a variable resistance memory device in accordance with example embodiments. Particularly, FIGS. 5, 7, 10 and 13 are the plan views, and FIGS. 6, 8-9, 11-12 and 14-15 are the cross-sectional views.

Figure 8:
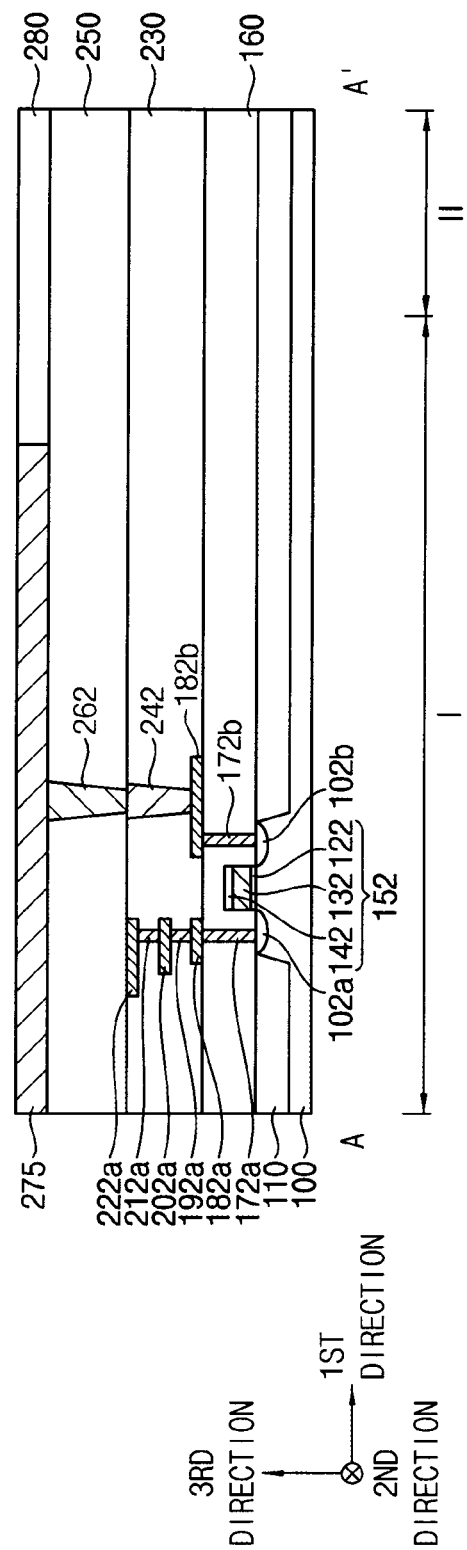
Figure 9:
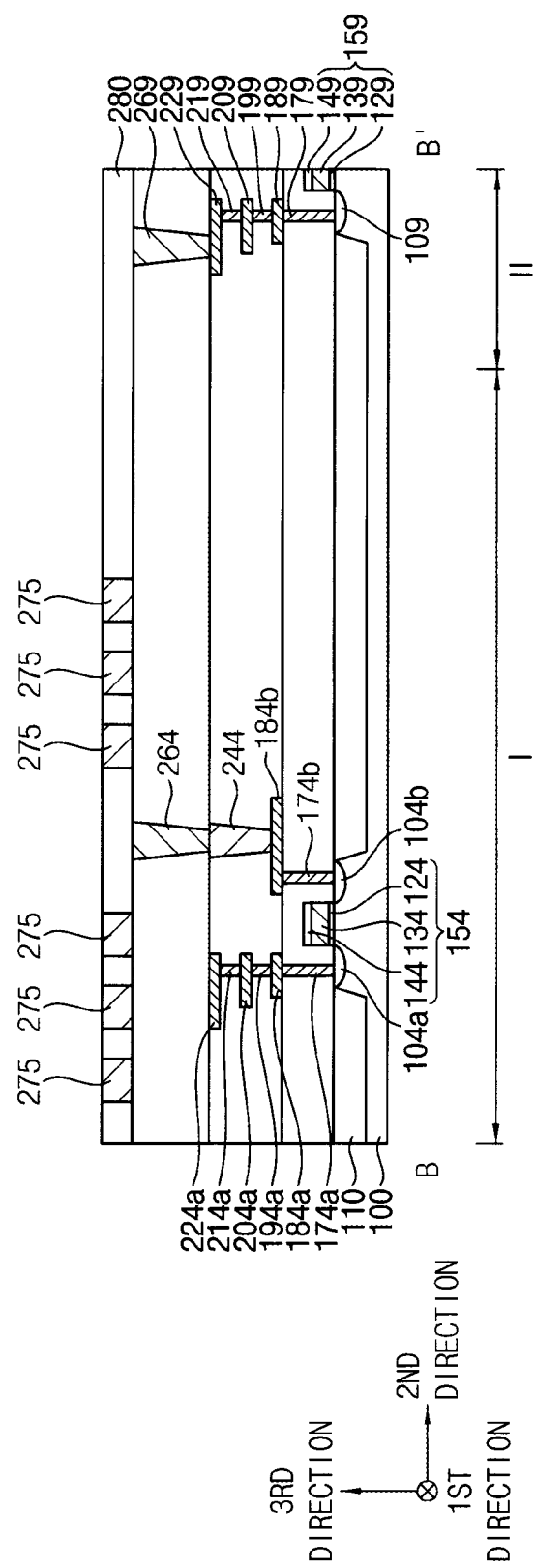
Figure 13:
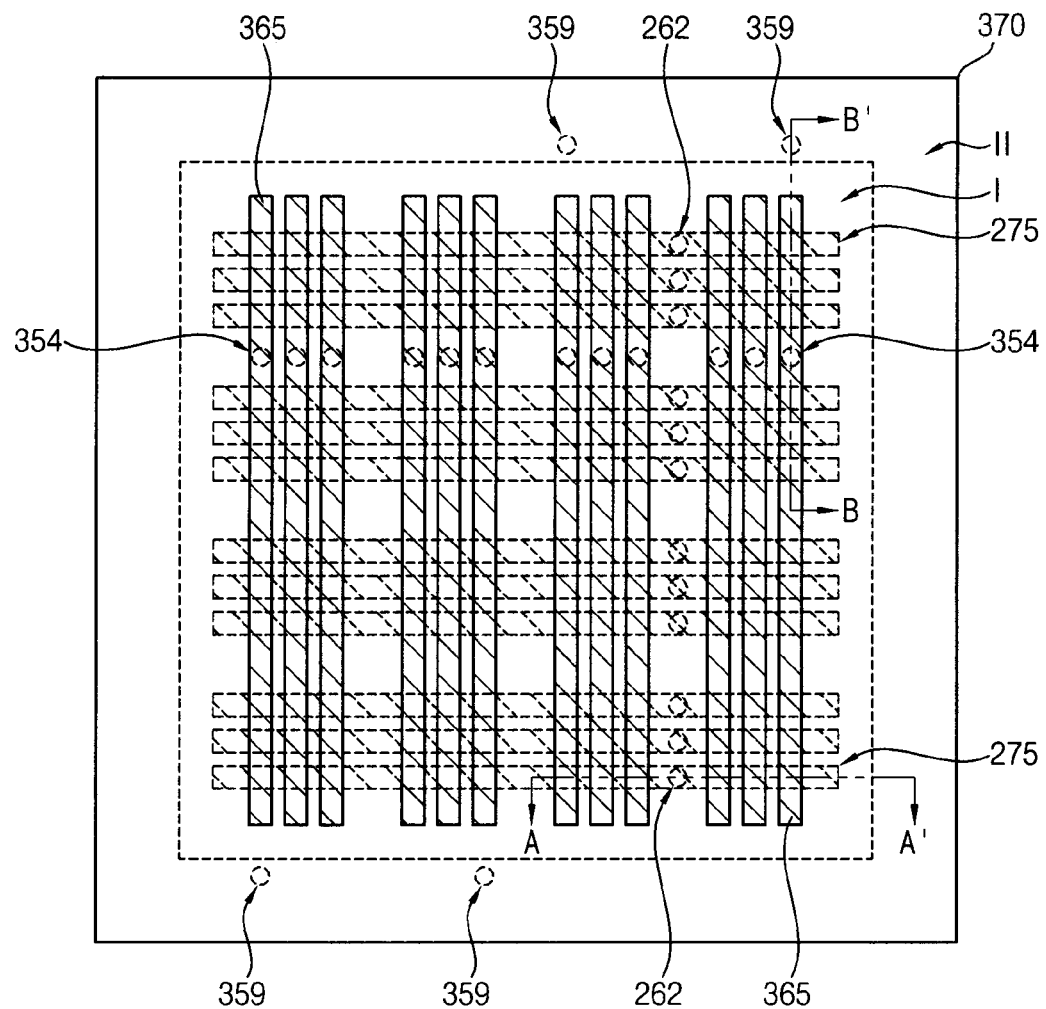
Figure 14:
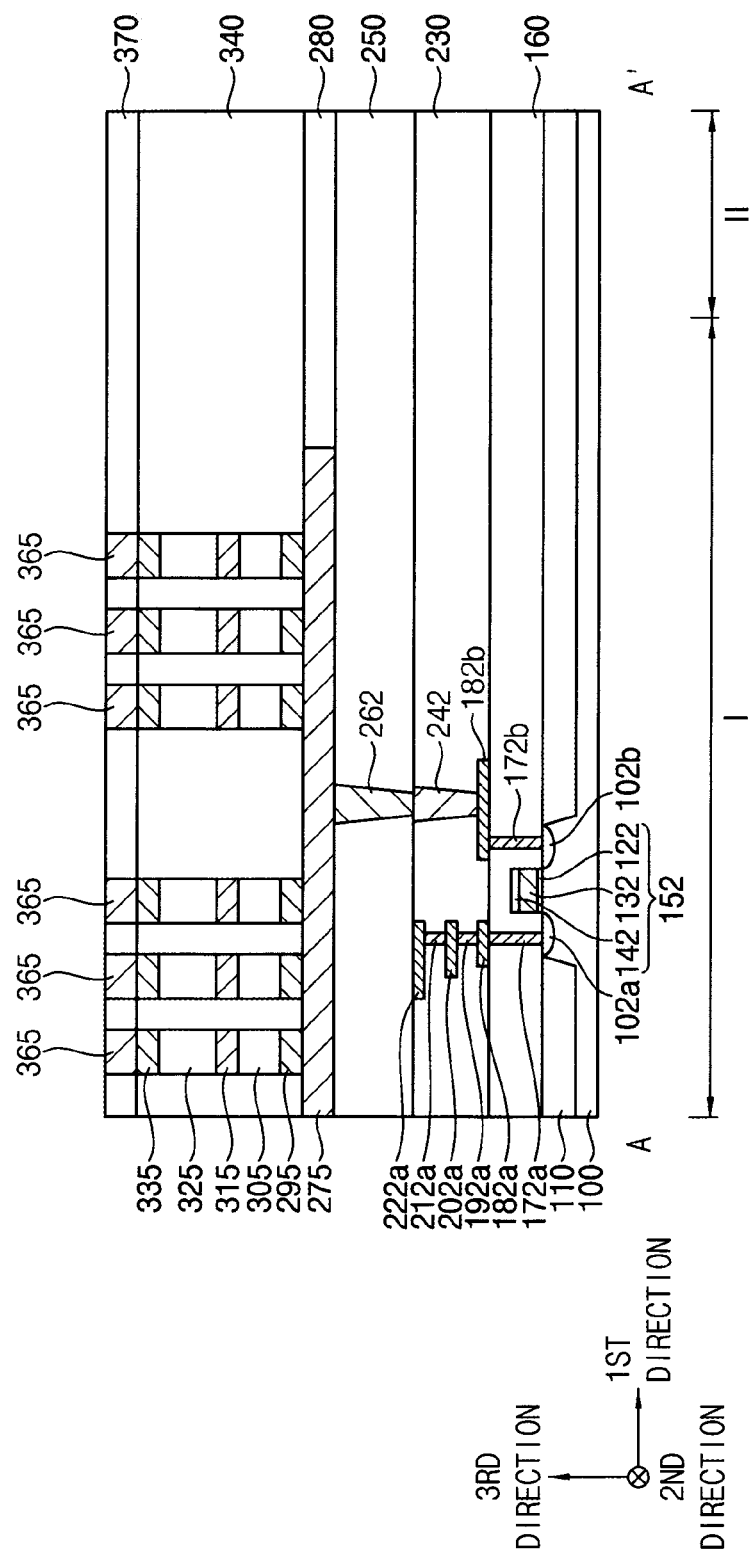
Figure 15:
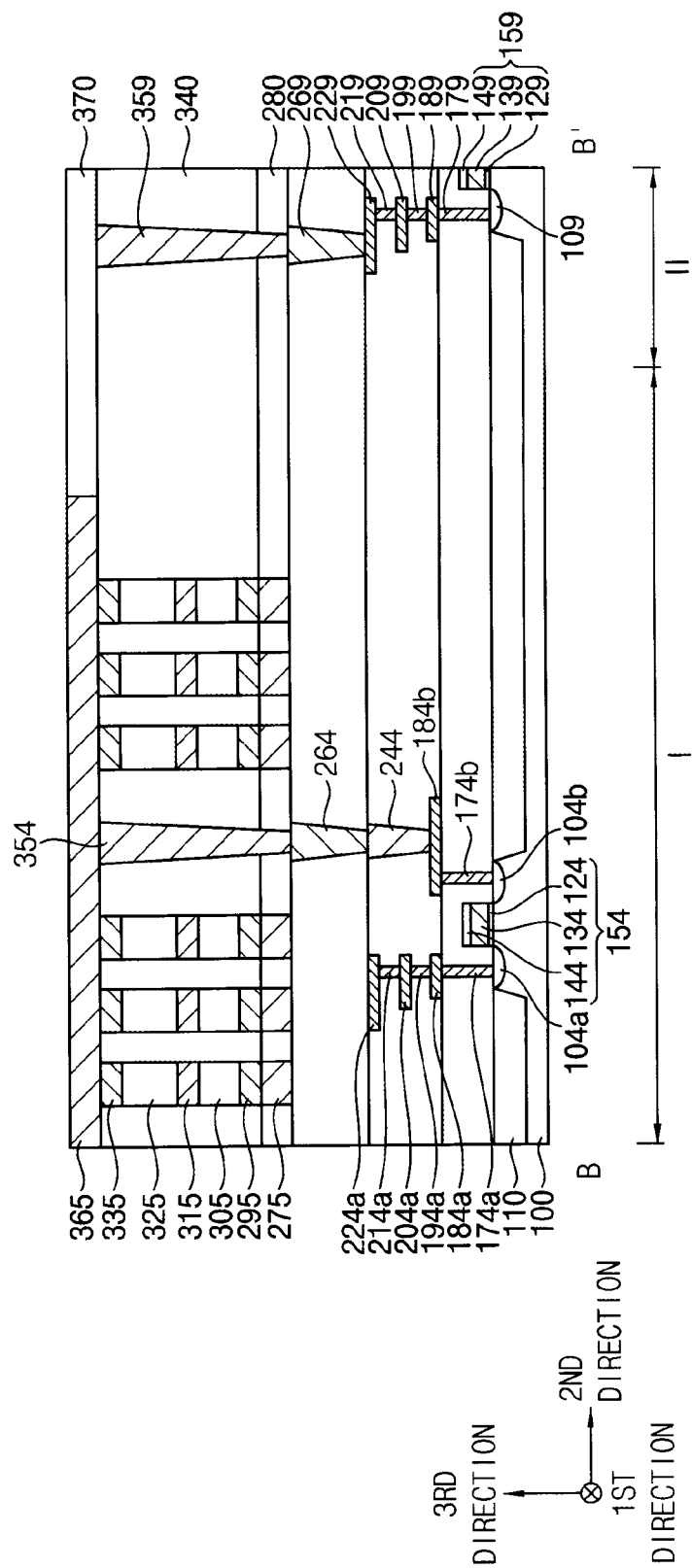

FIGS. 6, 8, 11 and 14 are cross-sectional views taken along lines A-A' of corresponding plan views, respectively, and FIGS. 9, 13 and 15 are cross-sectional views taken along lines B-B' of corresponding plan views, respectively.

Figure 5:
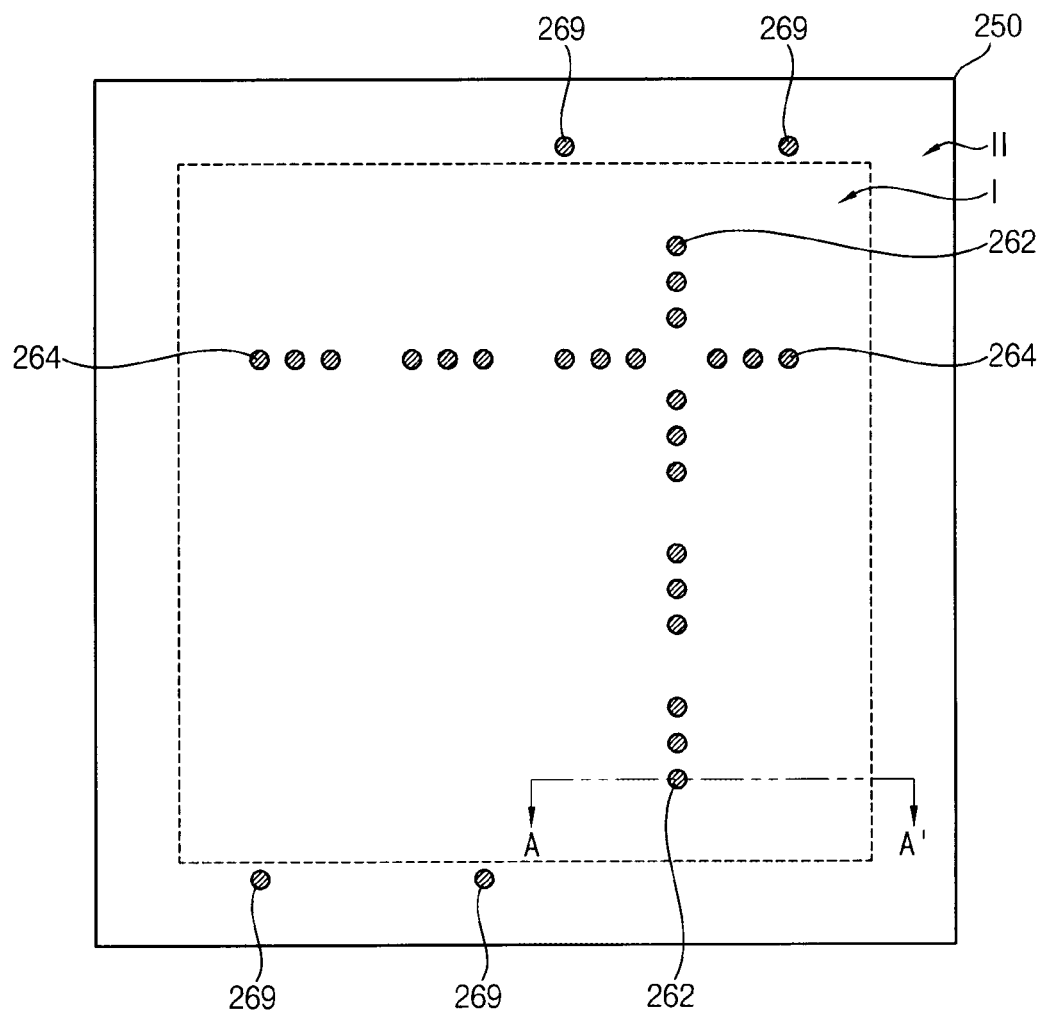
FIGS. 5 to 15 are plan views and cross-sectional views of stages in a method of manufacturing a variable resistance memory device in accordance with example embodiments.
Figure 6:
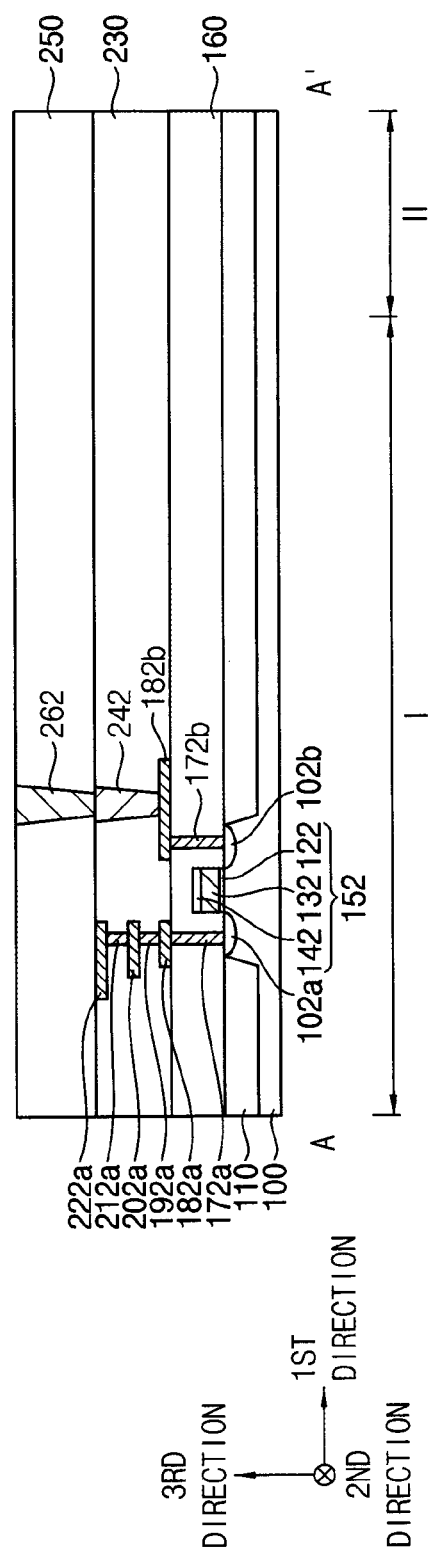

Referring to FIGS. 5 and 6, a circuit pattern may be formed on first and second regions I and II of a substrate 100, and first and second insulating interlayers 160 and 230 may be formed on the substrate 100 to cover the circuit pattern.

The substrate 100 may include a field region (on which an isolation pattern 110 is formed), and an active region 105 (on which no isolation pattern is formed). The isolation pattern 110 may be formed by, e.g., a shallow trench isolation (STI) process, and may include an oxide, e.g., silicon oxide.

In an implementation, the variable resistance memory device may have a cell over periphery (COP) structure. In an implementation, a circuit region in which the circuit pattern is formed and a memory cell region in which memory cells are formed may be vertically stacked on the substrate 100.

The circuit pattern may include transistors, lower contact plugs, lower wirings, lower vias, or the like. In an implementation, a first transistor including a first lower gate structure 152 and first and second impurity regions 102a and 102b at upper portions of the active regions 105 adjacent thereto may be formed on the first region I of the substrate 100. A second transistor may be formed to be spaced apart from the first transistor in the first direction and/or in the second direction on the first region I of the substrate 100, and a third transistor may be formed on the second region II of the substrate 100.

The first lower gate structure 152 may include a first lower gate insulation pattern 122, a first lower gate electrode 132, and a first lower gate mask 142 sequentially stacked.

Figure 7:
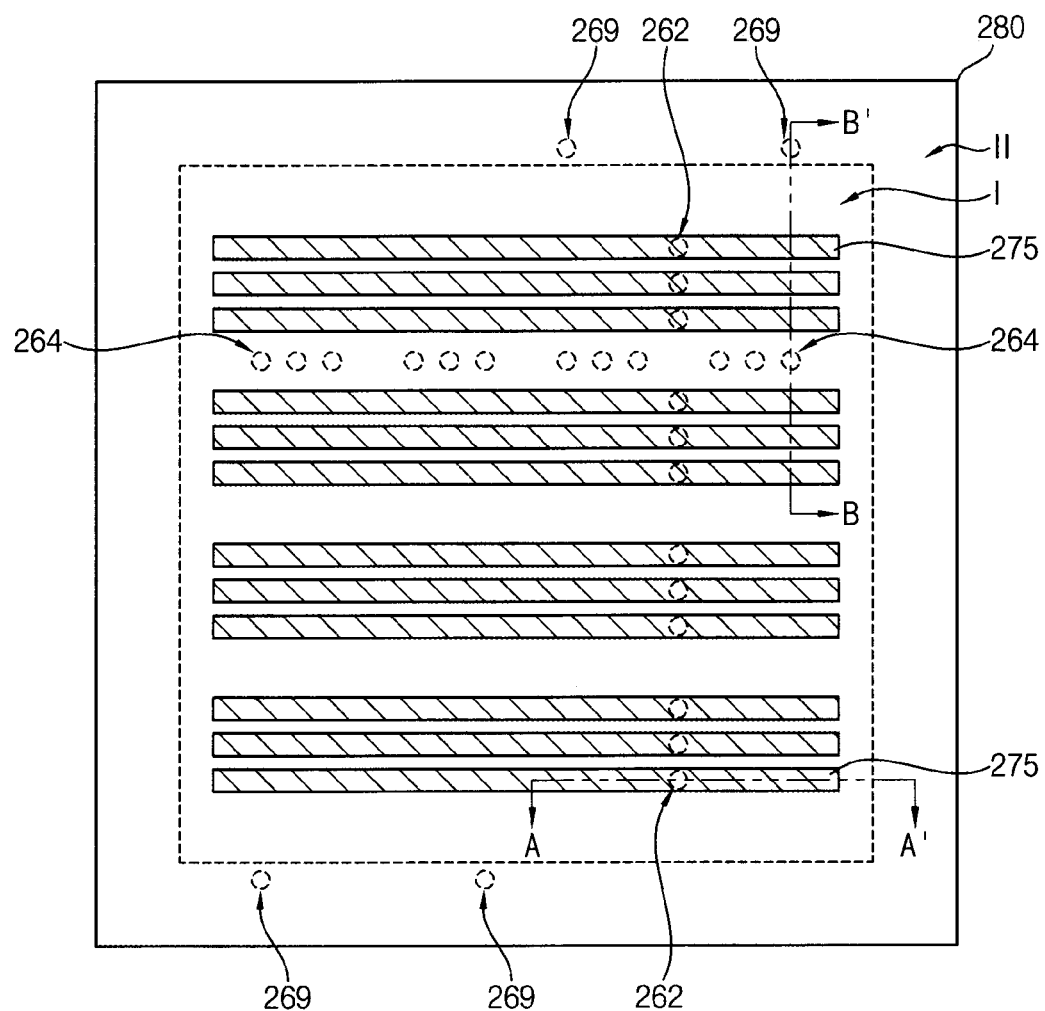

Referring to FIGS. 7 and 9, the second transistor may include a second lower gate structure 154 and third and fourth impurity regions 104a and 104b at upper portions of the active region 105 adjacent thereto on the first region I of the substrate 100, and the third transistor may include a third lower gate structure 159 and a fifth impurity region 109 and a sixth impurity region at upper (e.g., in the third direction) portions of the active region 105 adjacent thereto on the second region II of the substrate 100.

The second lower gate structure 154 may include a second lower gate insulation pattern 124, a second lower gate electrode 134, and a second lower gate mask 144 sequentially stacked. The third lower gate structure 159 may include a third lower gate insulation pattern 129, a third lower gate electrode 139, and a third lower gate mask 149 sequentially stacked.

The first insulating interlayer 160 may be formed on the substrate 100 to cover the first to third transistors, and first and second gate contact plugs 172a and 172b may extend through the first insulating interlayer 160 to contact the first and second impurity regions 102a and 102b. Third and fourth gate contact plugs 174a and 174b may extend through the first insulating interlayer 160 to contact the third and fourth impurity regions 104a and 104b, respectively. A fifth gate contact plug 179 may extend through the first insulating interlayer 160 to contact the fifth impurity region 109.

First and second lower wirings 182a and 182b may be formed on the first insulating interlayer 160 to contact upper surfaces (e.g., surfaces that face away from the substrate 100 in the third direction) of the first and second gate contact plugs 172a and 172b, respectively. A first lower via 192a, a third lower wiring 202a, a second lower via 212a, and a fourth lower wiring 222a may be sequentially stacked on the first lower wiring 182a, and a first lower contact plug 242 may be formed on the second lower wiring 182b. The fourth lower wiring 222a may be electrically connected to other transistors. Fifth and sixth lower wirings 184a and 184b may be formed on the first insulating interlayer 160 to contact upper surfaces of the third and fourth gate contact plugs 174a and 174b, respectively, and a second lower contact plug 244 may be formed on the sixth lower wiring 184b.

The first to fifth gate contact plugs 172a, 172b, 174a, 174b and 179, and the first and second lower contact plugs 242 and 244 may be referred to as a lower contact plug.

The fifth and sixth lower wirings 184a and 184b, seventh and eighth lower wirings 204a and 224a, and third and fourth lower vias 194a and 214a may be electrically connected to the second transistor on the first region I of the substrate 100, and ninth to eleventh lower wirings 189, 209 and 229 and fifth and sixth lower vias 196 and 216 may be electrically connected to the third transistor on the second region II of the substrate 100. A first conductive pattern 269 may be formed on the eleventh lower wiring 229.

In an implementation, each of the second lower contact plug 244, the second contact plug 264, and the first conductive pattern 269 may include copper. In an implementation, each of the second lower contact plug 244 and the first conductive pattern 269 may include copper, and the second contact plug 264 may include tungsten.

In an implementation, the first to fourth lower wirings 182a, 182b, 202a and 222a, and the first and second lower vias 192a and 212a may be formed by a damascene process or a patterning process. Each of the first to fourth lower wirings 182a, 182b, 202a and 222a and the first and second lower vias 192a and 212a may include copper.

The second insulating interlayer 230 may be formed on the first insulating interlayer 160 to cover the first to fourth lower wirings 182ad, 182b, 202a and 222a, the first and second lower vias 192a and 212a, and the first and second lower contact plugs 242 and 244. In an implementation, the second insulating interlayer 230 may be merged with the first insulating interlayer 160.

The first contact plug 262 may be formed on the second insulating interlayer 230 through the third insulating interlayer 250, and may contact an upper surface of the first lower contact plug 242.

In an implementation, each of the first lower contact plug 242 and the first contact plug 262 may be formed by a single damascene process. In an implementation, the first lower contact plug 242 and the first contact plug 262 may include different materials, e.g., copper and tungsten, respectively. In an implementation, the first lower contact plug 242 and the first contact plug 262 may be formed by a dual damascene process. In an implementation, the first lower contact plug 242 and the first contact plug 262 may include substantially the same material, e.g., copper.

In an implementation, as illustrated in FIG. 5, an upper surface of the first contact plug 262 may have a circular shape in a plan view. In an implementation, the upper surface may have an elliptical shape or a polygonal shape.

The third insulating interlayer 250 may be formed on the second insulating interlayer 230 and may cover a sidewall of the first contact plug 262. In an implementation, the third insulating interlayer 250 may be merged with the second insulating interlayer 230.

Referring to FIGS. 7 to 9, a first conductive line 275 and a fourth insulating interlayer 280 covering a sidewall of the first conductive line 275 may be formed on the first region I of the substrate 100.

In an implementation, the first conductive line 275 may be formed by forming a first conductive line on the third insulating interlayer 250 and the first and second contact plugs 262 and 264, forming a first etching mask on the first conductive line, and etching the first conductive line using the first etching mask. In an implementation, the first etching mask may be formed by a double patterning process.

The first conductive line 275 may contact an upper surface of the first contact plug 262, and may be electrically connected to the first transistor on the first region I of the substrate 100.

In an implementation, the first conductive line 275 may extend in the first direction, and a plurality of first conductive lines 275 may be spaced apart from each other in the second direction. Some of the first conductive lines 275 may form a first conductive line structure. In an implementation, the first conductive line structure may include three first conductive lines 275, and four first conductive line structures may be spaced apart from each other in the second direction on the first region I of the substrate 100.

In an implementation, the first conductive line 275 may serve as a word line of the variable resistance memory device. In an implementation, the first conductive line 275 may serve as a bit line of the variable resistance memory device.

A fourth insulating interlayer 280 may be formed on the third insulating interlayer 250 and may cover sidewalls of the first conductive lines 275.

Figure 10:
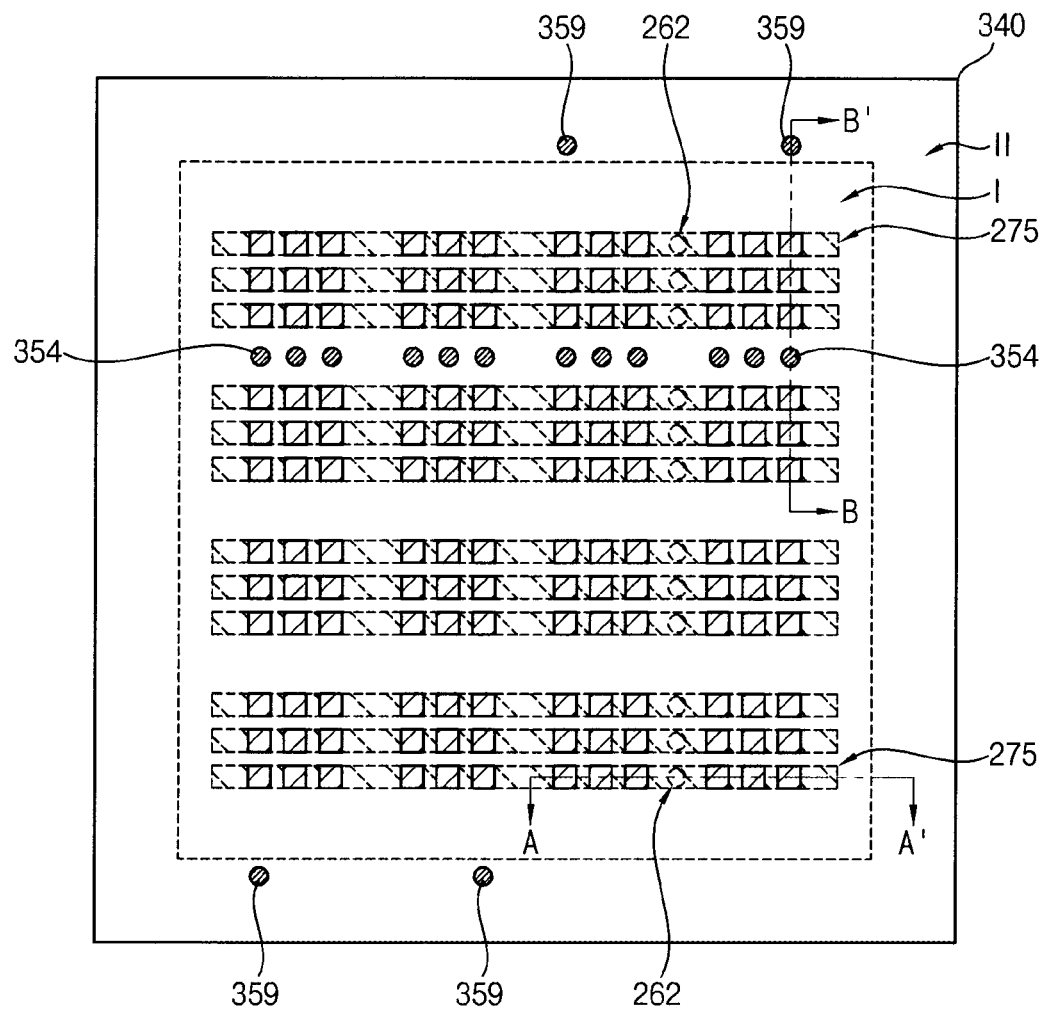
Figure 11:
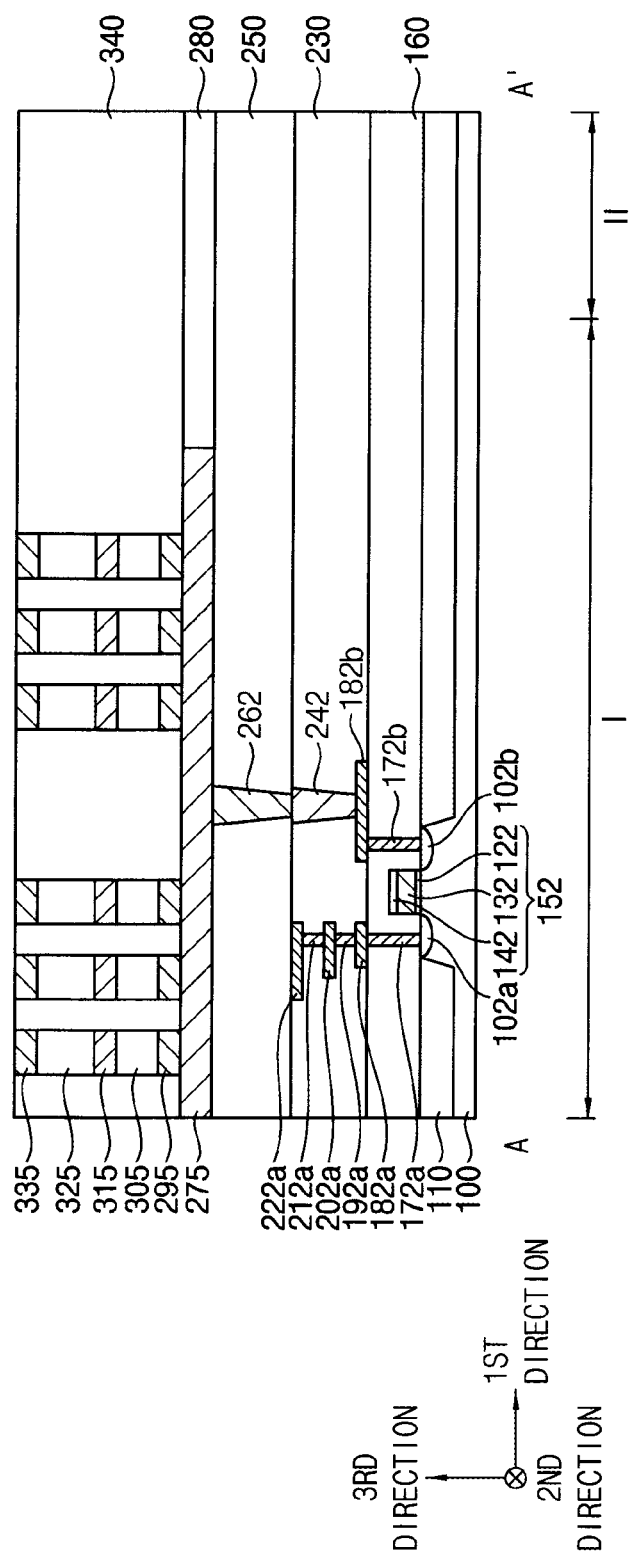

Referring to FIGS. 10 and 11, a first electrode 295, a first selection pattern 305, a second electrode 315, a first variable resistance pattern 325 and a third electrode 335 may be sequentially stacked on the first conductive line 275. The second electrode 315, the first variable resistance pattern 325 and the third electrode 335 may form a first memory unit.

In an implementation, a first electrode layer, a selection layer, a second electrode layer, a variable resistance layer and a third electrode layer may be sequentially formed on the first conductive line 275 and the fourth insulating interlayer 280, and may be etched using second and third etching masks, or using only one etching mask.

In an implementation, the first electrode 295, the first selection pattern 305 and the first memory unit sequentially stacked may form a first memory cell, and a plurality of first memory cells may be spaced apart from each other in each of the first and second directions.

Some of the first memory cells may form a first cell array. In an implementation, the first cell array may include nine first memory cells, and sixteen first cell arrays may be spaced apart from each other in the second direction on the first region I of the substrate 100.

A fifth insulating interlayer 340 may be formed on the fourth insulating interlayer 280 and the first conductive line 275 and may cover sidewalls of the first electrode 295, the first selection pattern 305 and the first memory unit.

Figure 12:
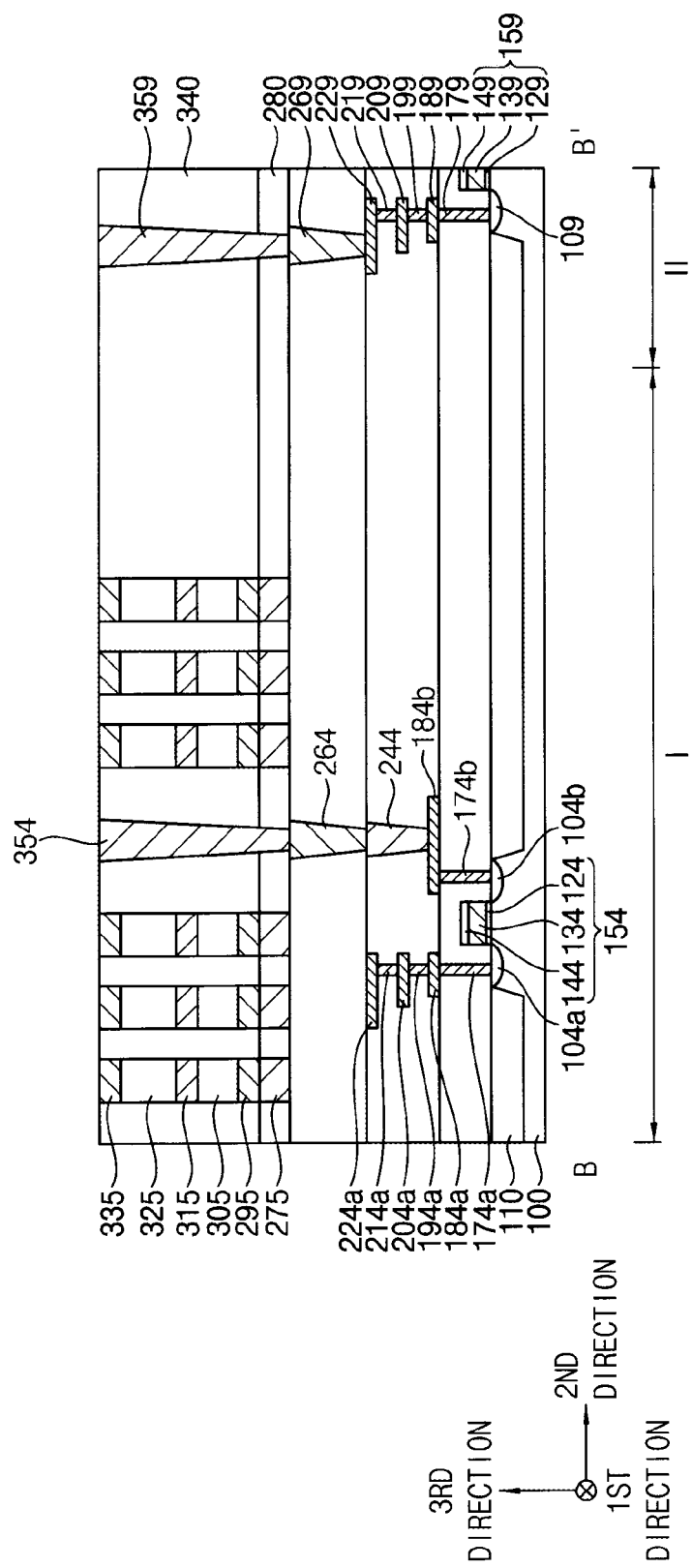

Referring to FIG. 12, a third contact plug 354 may be formed through a portion of the fifth insulating interlayer 340 between adjacent ones of the first memory units (e.g., adjacent ones in the second direction) to contact an upper surface of the first contact plug 262 on the first region I of the substrate 100, and a second conductive pattern 359 may be formed through a portion of the fifth insulating interlayer 340 on the second region II of the substrate 100 to contact an upper surface of the first conductive pattern 269.

In an implementation, a plurality of third contact plugs 354 may be spaced apart from each other in the first direction. In an implementation, the third contact plugs 354 may be formed at locations not overlapping the first conductive line structures in the third direction and overlapping second conductive line structures (which are to be formed at a later stage). In an implementation, three third contact plugs 354 may form a third contact plug structure, and a plurality of third contact plug structures may be spaced apart from each other in the first direction. A distance between adjacent third contact plug structures in the first direction may be greater than a distance between adjacent the third contact plugs 354 in the first direction within each of the third contact plug structures.

In an implementation, the third contact plug 354 may include tungsten, and the second conductive pattern 359 may include copper.

The third contact plug 354 and the second conductive pattern 359 may be formed by, e.g., a damascene process.

Referring to FIGS. 13 to 15, a second conductive line 365 and a sixth insulating interlayer 370 covering a sidewall of the second conductive line 365 may be formed on the fifth insulating interlayer 340, the first memory units, and the third contact plugs 354.

In an implementation, the second conductive line 365 may be formed by forming a second conductive layer on the fifth insulating interlayer 340, the first memory units, and the third contact plugs 354, forming a fourth etching mask on the second conductive layer, and etching the second conductive layer using the fourth etching mask. In an implementation, the fourth etching mask may be formed by a damascene process.

The second conductive line 365 may contact an upper surface of the third contact plug 354, and may be electrically connected to the second transistor on the first region I of the substrate 100.

In an implementation, the second conductive line 365 may extend in the second direction, and a plurality of second conductive lines 365 may be spaced apart from each other in the first direction. Some of the second conductive lines 365 may form a second conductive line structure. In an implementation, the second conductive line structure may include three second conductive lines 365, and four second conductive line structures may be spaced apart from each other in the first direction on the first region I of the substrate 100.

In an implementation, the second conductive line 365 may serve as a bit line of the variable resistance memory device. In an implementation, the second conductive line 365 may serve as a word line of the variable resistance memory device.

In an implementation, the third contact plug 354 may extend from a bottom surface of the second conductive line 365 to at least a level at which a bottom surface of the first conductive line 275 is formed, and may not overlap any of the first memory units in the third direction.

Referring to FIGS. 2 to 4 again, a seventh insulating interlayer 600 may be formed on the sixth insulating interlayer 370 and the second conductive line 365, and a third conductive pattern 659 may be formed through the sixth and seventh insulating interlayers 370 and 600 to contact an upper surface of the second conductive pattern 359.

An eighth insulating interlayer 700 may be formed on the seventh insulating interlayer 600 and the third conductive pattern 659, and an upper wiring 730 may be formed through the eighth insulating interlayer 700 to contact an upper surface of the third conductive pattern 659. The first to third conductive patterns 269, 359 and 659 sequentially stacked on the second region II of the substrate 100 may form a conductive structure.

In an implementation, the upper wiring 730 may be formed by a damascene process.

The upper wiring 730 may be formed on the second region II of the substrate 100 and may extend to a portion of the first region I of the substrate 100 to contact the upper surface of the third conductive pattern 659. In an implementation, the upper wiring 730 may be electrically connected to the third transistor.

In an implementation, as illustrated in FIG. 2, the upper wiring 730 may have an L-like shape in a plan view.

Upper wirings may be further formed to complete the fabrication of the variable resistance memory device.

As described above, the third contact plug 354 (directly contacting the second conductive line 365 among the contact plugs on the first region I of the substrate 100) may not include copper and may include tungsten. An electromigration (EM) phenomenon or an increase of bias temperature stress (BTS) may not occur in a structure including tungsten even if it has a small size, and the third contact plug 354 including tungsten may have a reduced size.

In an implementation, the third contact plug 354 may extend on the first region I of the substrate 100 through the fifth insulating interlayer 340 (between the first memory units) in the third direction, and may directly extend in the third direction on the first region I to be electrically connected to the first transistor without passing through the second region II of the substrate 100.

Figure 16:
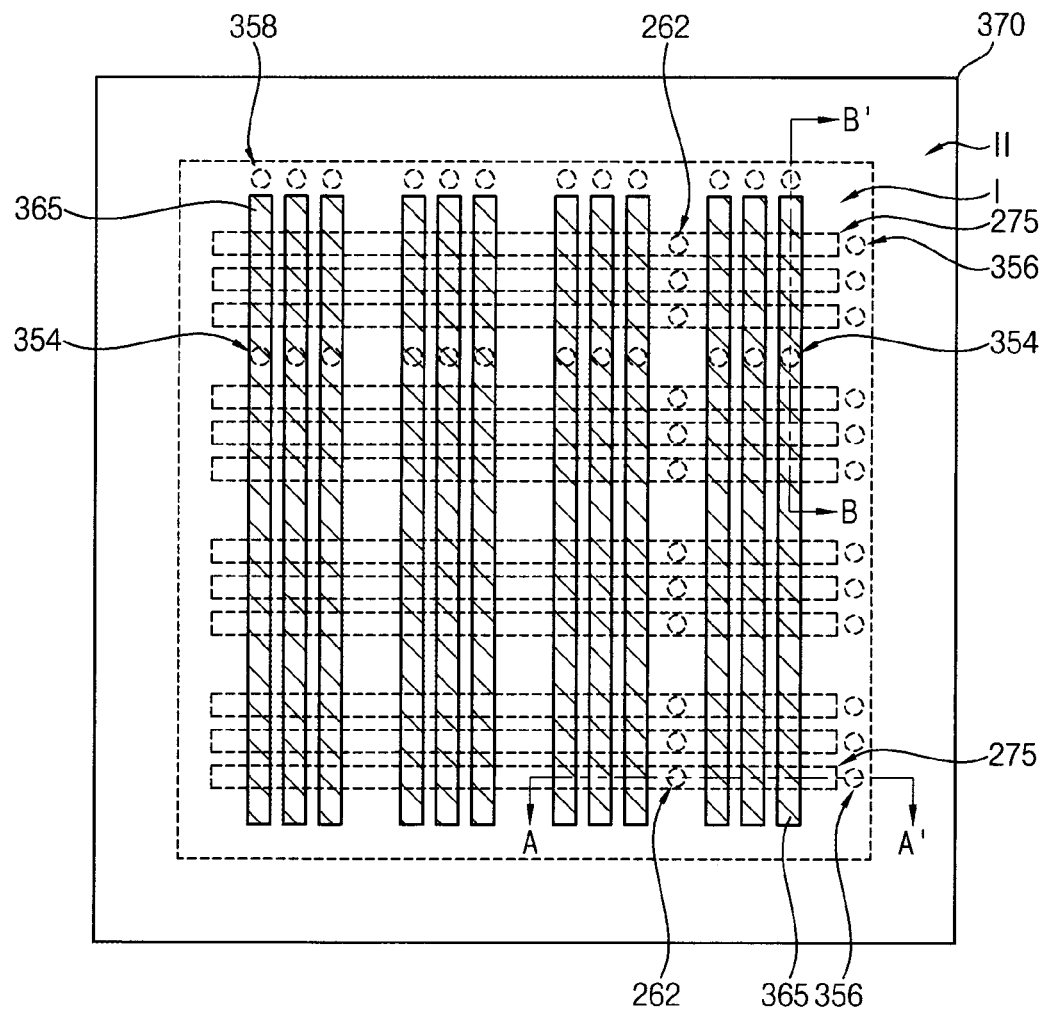
FIGS. 16 to 24 are plan views and cross-sectional views of stages in a method of manufacturing a variable resistance memory device in accordance with example embodiments.
Figure 16:
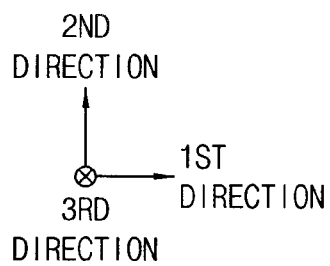
Figure 17:
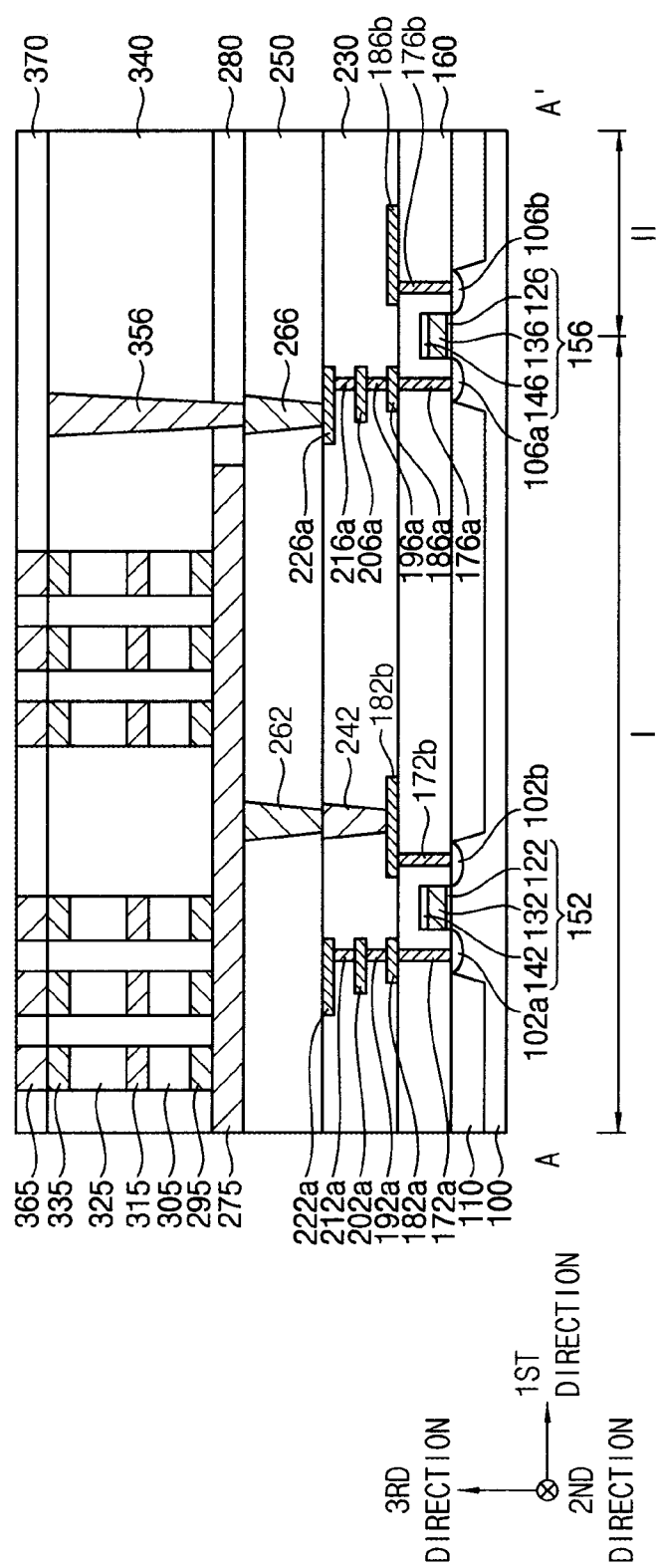
Figure 18:
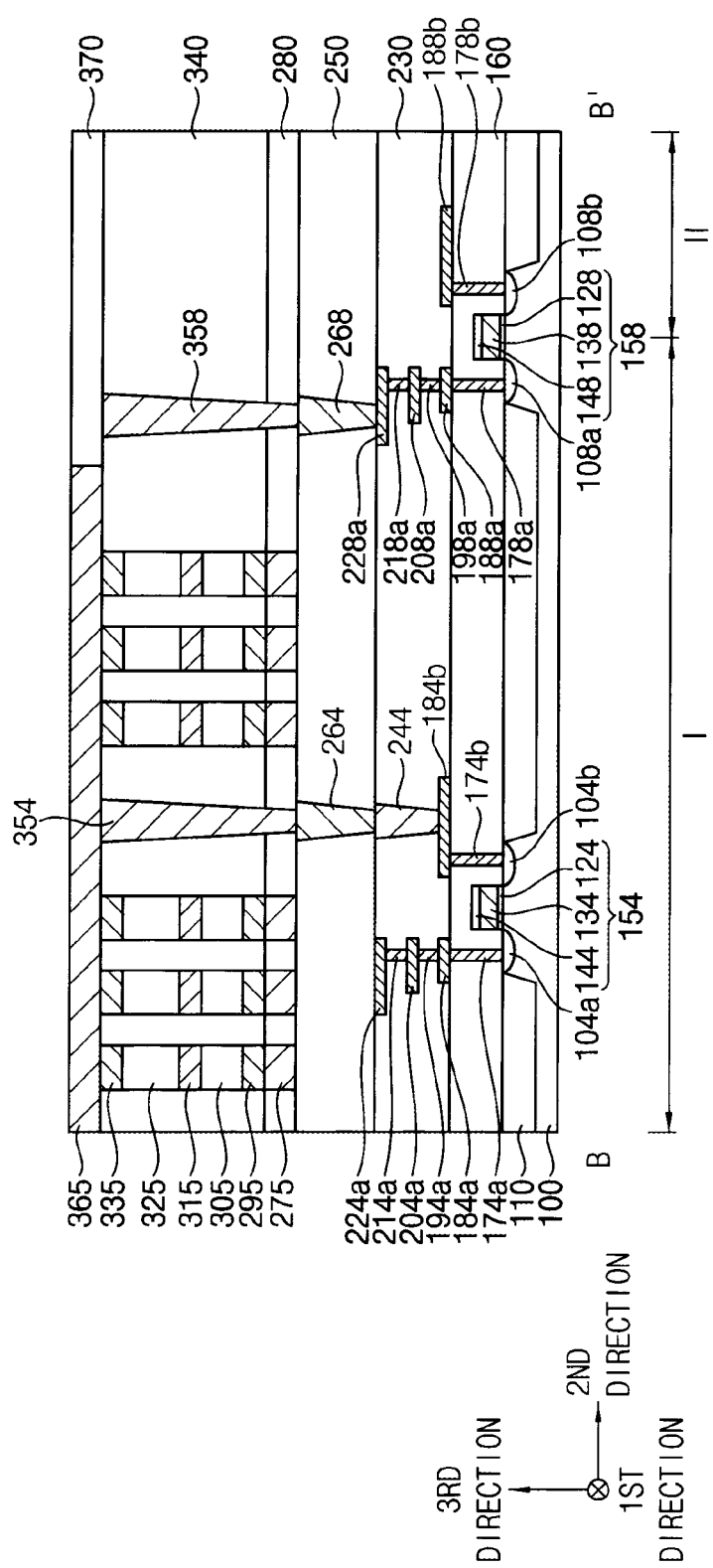
Figure 19:
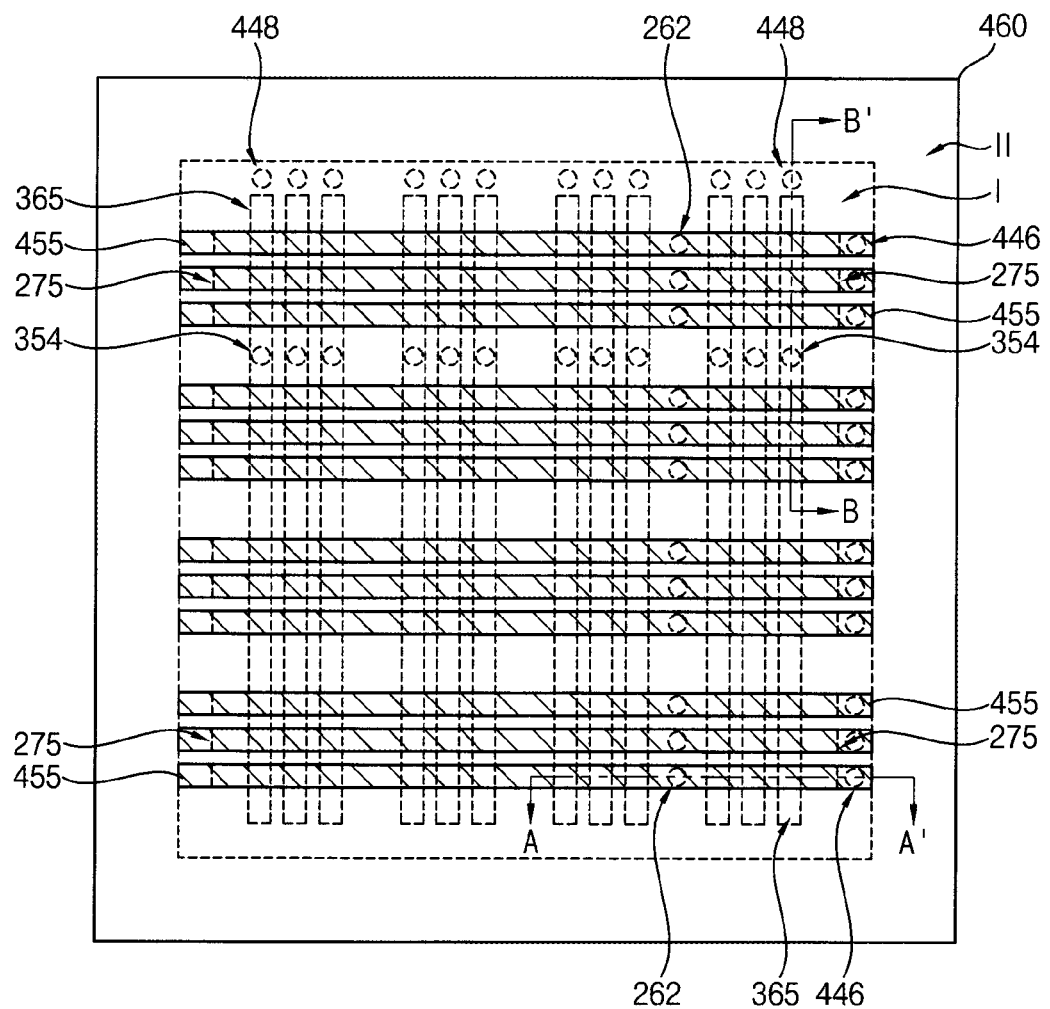
Figure 20:
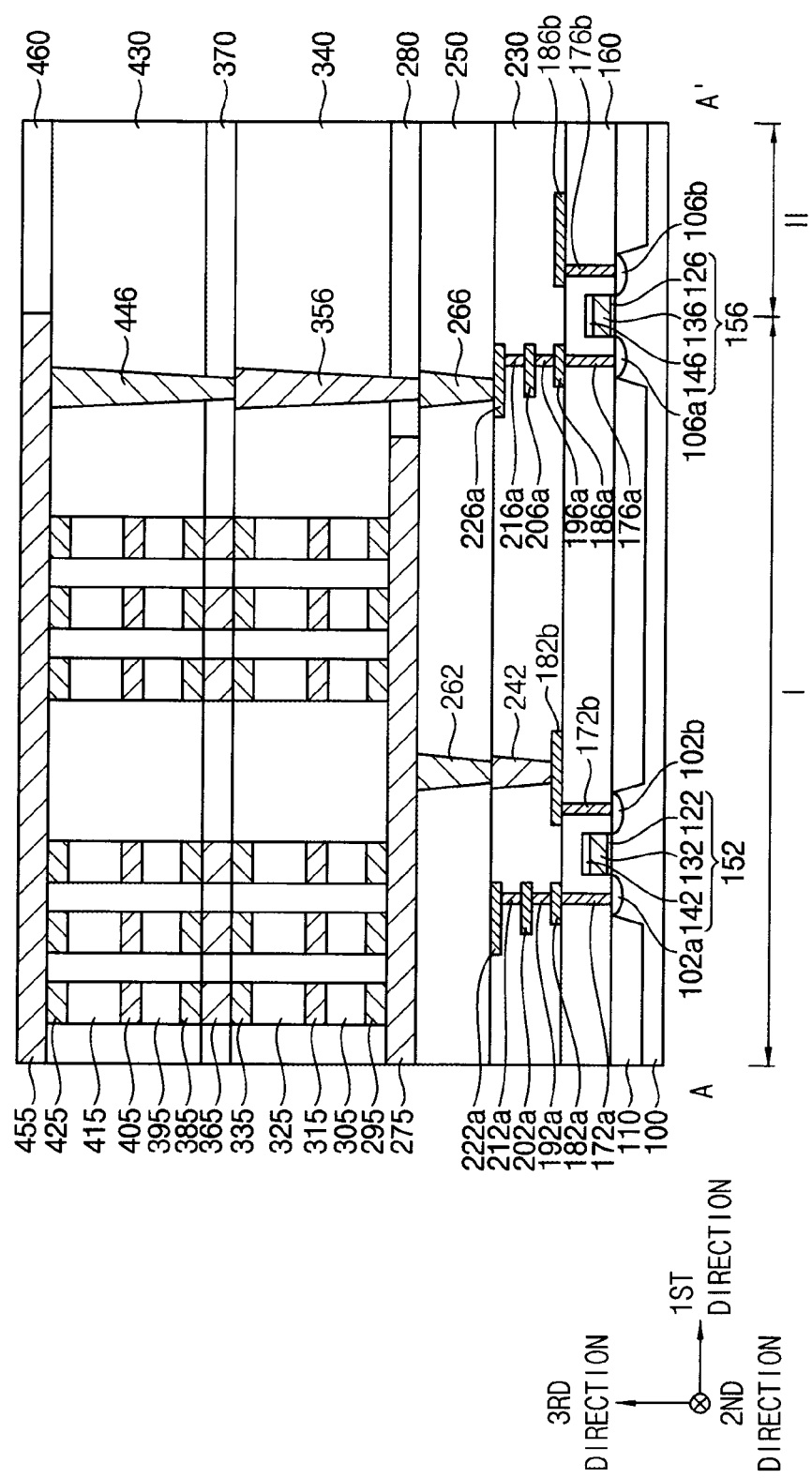
Figure 21:
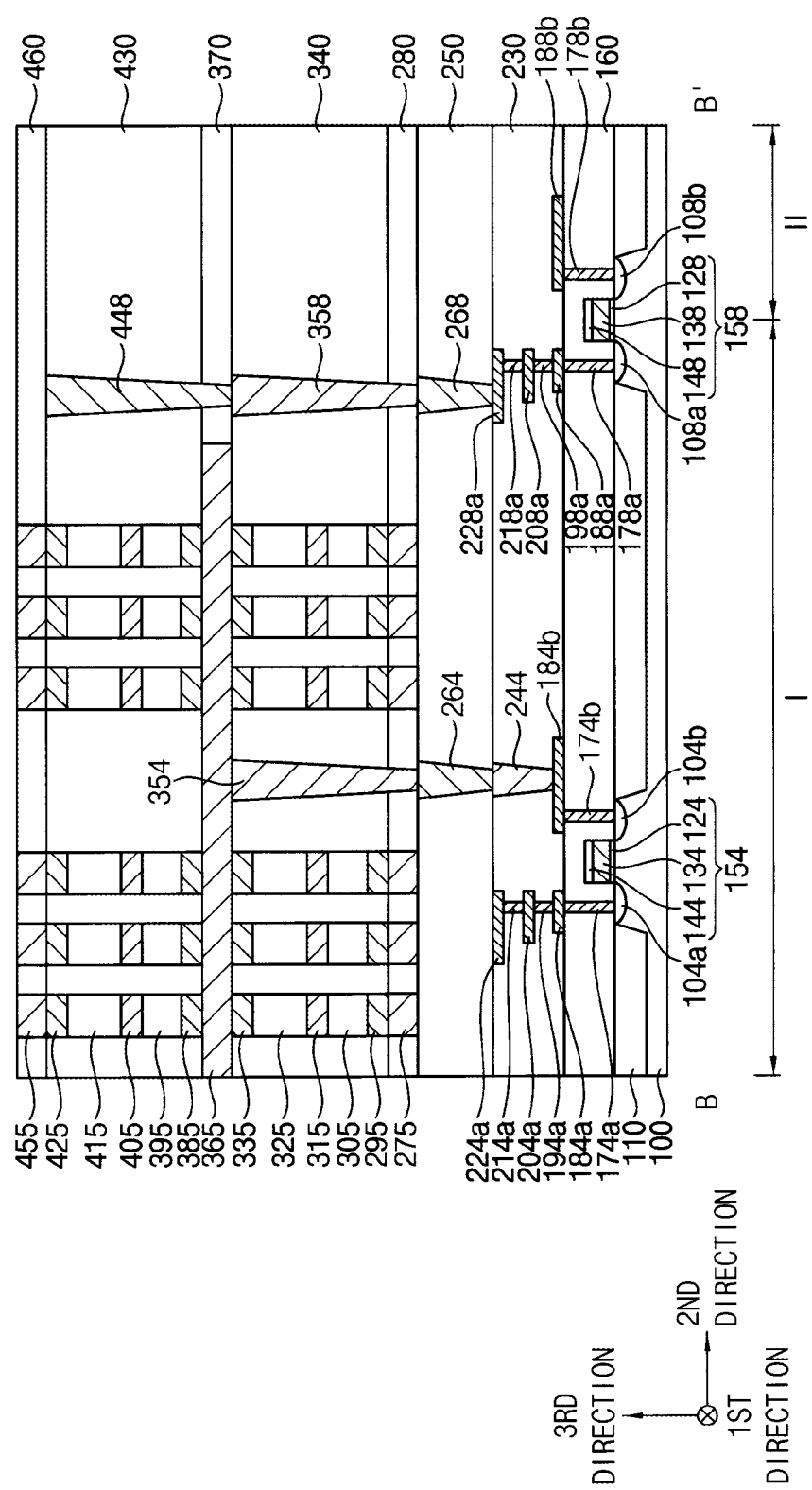
Figure 22:
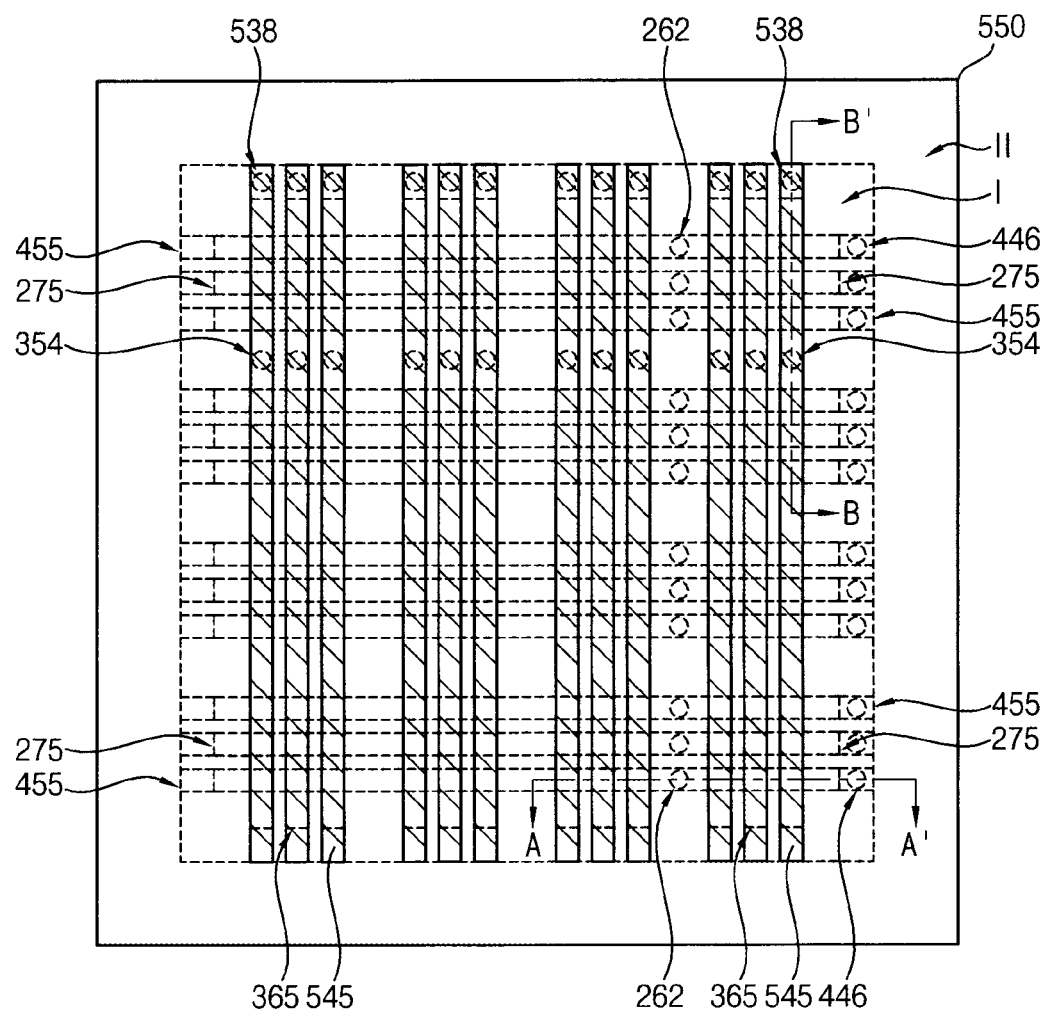
Figure 22:
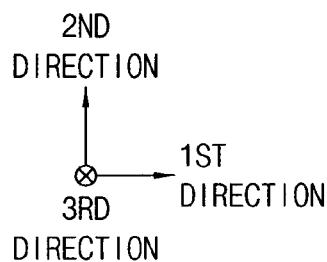

FIGS. 16 to 24 are plan views and cross-sectional views of stages in a method of manufacturing a variable resistance memory device in accordance with example embodiments. Particularly, FIGS. 16, 19 and 22 are the plan views, and FIGS. 17, 18, 20, 21, 23 and 24 are the cross-sectional views.

Figure 23:
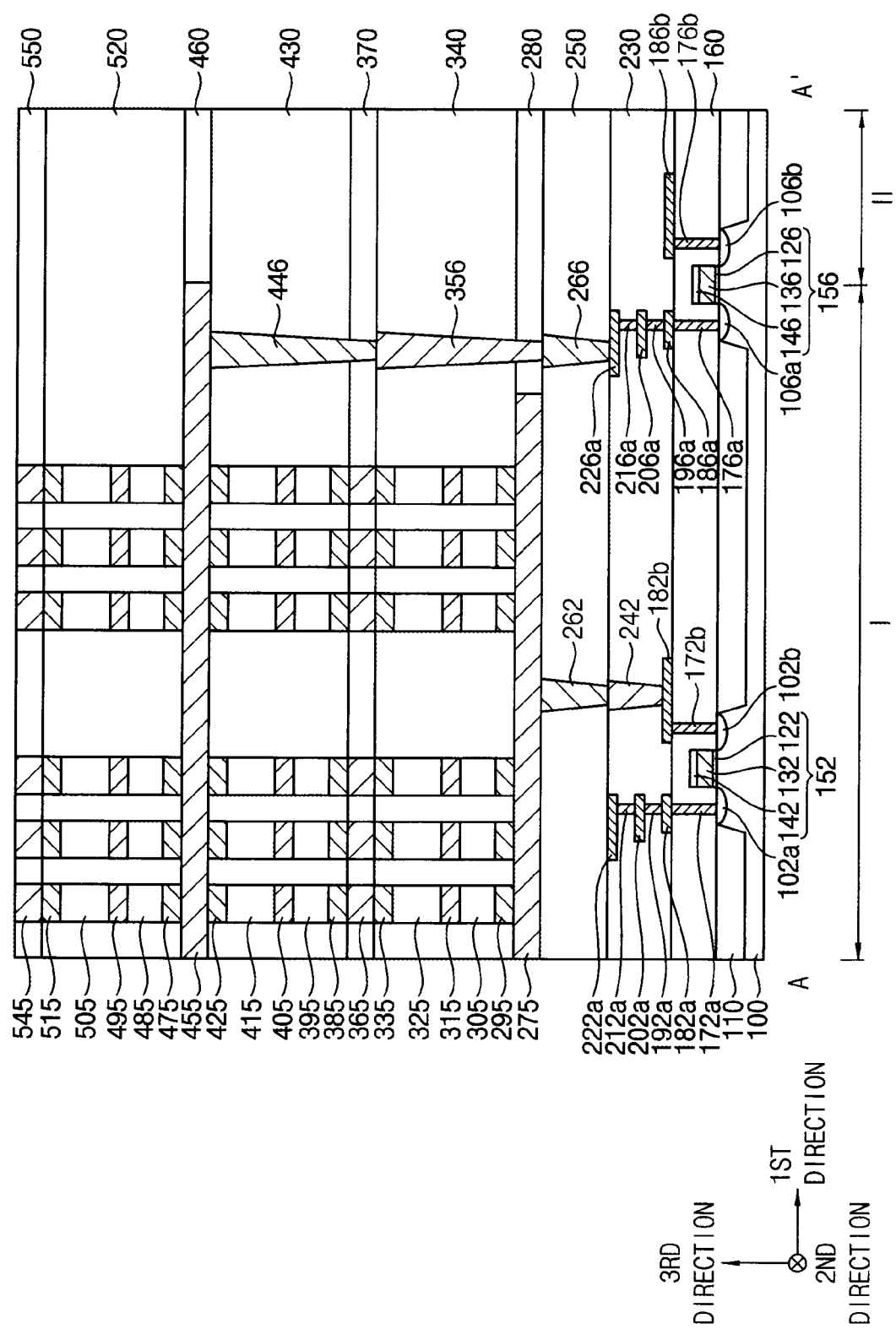
Figure 24:
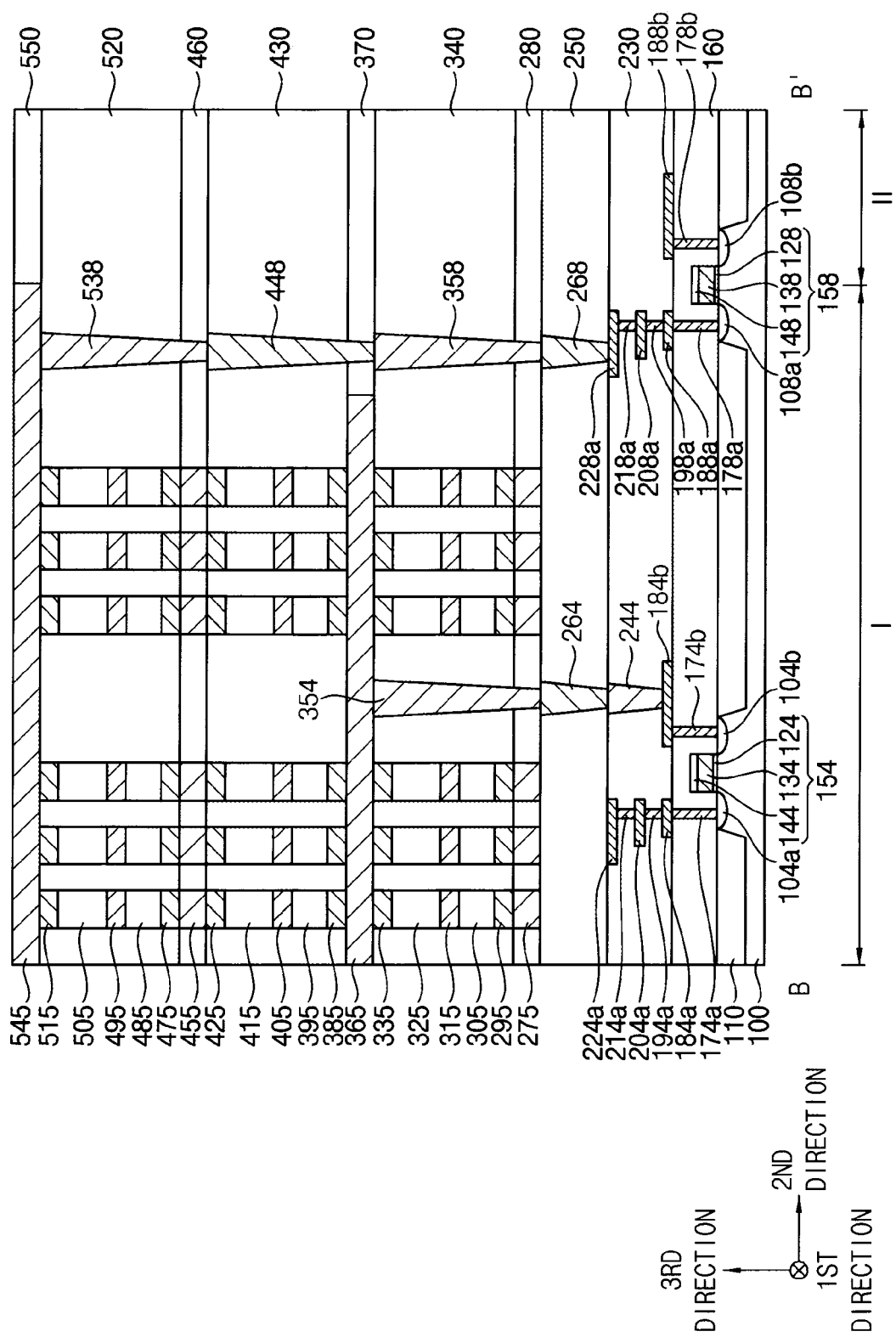

FIGS. 17, 20, and 23 are cross-sectional views taken along lines A-A' of corresponding plan views, respectively, and FIGS. 18, 21 and 24 are cross-sectional views taken along lines B-B' of corresponding plan views, respectively.

This method may include processes substantially the same as or similar to those illustrated with reference to FIGS. 5 to 15. Thus, like reference numerals refer to like elements, and repeated descriptions thereon may be omitted herein.

Hereinafter, elements on the second region II of the substrate 100, e.g., the third transistor, the upper wirings electrically connected thereto, and the conductive structure between the third transistor and the upper wirings will not be described.

Referring to FIGS. 16 to 18, processes substantially the same as or similar to those illustrated with reference to FIGS. 5 to 15 may be performed.

In an implementation, fourth and fifth transistors may be further formed on a portion of the first region I of the substrate 100 adjacent the second region II of the substrate 100. Fourth and fifth contact plugs 266 and 356 may be formed on the fourth transistor to be electrically connected thereto, and sixth and seventh contact plugs 268 and 358 may be formed on the fifth transistor to be electrically connected thereto.

The fourth transistor may include a fourth lower gate structure 156 and seventh and eighth impurity regions 106a and 106b at upper portions of the active region 105 adjacent thereto on the first region I of the substrate 100, and sixth and seventh gate contact plugs 176a and 176b may be formed to contact the seventh and eighth impurity regions 106a and 106b. The fourth lower gate structure 156 may include a fourth lower gate insulation pattern 126, a fourth lower gate electrode 136 and a fourth lower gate mask 146 sequentially stacked.

The fifth transistor may include a fifth lower gate structure 158 and ninth and tenth impurity regions 108a and 108b at upper portions of the active region 105 adjacent thereto on the first region I of the substrate 100, and eighth and ninth gate contact plugs 178a and 178b may be formed to contact the ninth and tenth impurity regions 108a and 108b. The fifth lower gate structure 158 may include a fifth lower gate insulation pattern 128, a fifth lower gate electrode 138 and a fifth lower gate mask 148 sequentially stacked.

Twelfth to fifteenth lower wirings 186a, 186b, 206a and 226a and seventh and eighth lower vias 196a and 216a may be formed on the first region I of the substrate 100 to be electrically connected to the fourth transistor. The fourth contact plug 266 may be formed on the fifteenth lower wiring 226a, and the sixth contact plug 356 may be formed on the fourth contact plug 266.

Sixteenth to nineteenth lower wirings 188a, 188b, 208a, 228a, and ninth and tenth lower vias 198a and 218a may be formed on the first region I of the substrate 100 to be electrically connected to the fifth transistor. A fifth contact plug 268 may be formed on the nineteenth lower wiring 228a, and a seventh contact plug 358 may be formed on the fifth contact plug 268. The fourth to seventh contact plugs 266, 268, 356 and 358 may be formed on a portion of the first region I of the substrate 100 adjacent the second region II of the substrate 100.

In an implementation, each of the fourth and fifth contact plugs 266 and 268 may include copper, and each of the sixth and seventh contact plugs 356 and 358 may include tungsten. In an implementation, the fourth and fifth contact plugs 266 and 268 may include tungsten.

In an implementation, the fourth and sixth contact plugs 266 and 356 may be spaced apart from the first conductive line 275 in the first direction, and the fifth and seventh contact plugs 268 and 358 may be spaced apart from the second conductive line 365 in the second direction.

In an implementation, a plurality of third structures each including the fourth and sixth contact plugs 266 and 356 sequentially stacked may be arranged in the second direction, and a plurality of fourth structures each including the fifth and seventh contact plugs 268 and 358 may be arranged in the first direction.

Referring to FIGS. 19 to 21, processes substantially the same as or similar to those illustrated with reference to FIGS. 10 to 15 may be performed.

In an implementation, a fourth electrode 385, a second selection pattern 395 and a second memory unit sequentially stacked may be formed on the second conductive line 365, a ninth insulating interlayer 430 may be formed on the eighth insulating interlayer 370 to cover sidewalls of the fourth electrode 385, the second selection pattern 395 and the second memory unit, and a third conductive line 455 and a tenth insulating interlayer 460 covering a sidewall of the third conductive line 455 may be formed on the ninth insulating interlayer 430 and the second memory unit. The second memory unit may include a fifth electrode 405, a second variable resistance pattern 415 and a sixth electrode 425 sequentially stacked.

The fourth electrode 385, the second selection pattern 395 and the second memory unit sequentially stacked may form a second memory cell, and a plurality of second memory cells may be spaced apart from each other in each of the first and second directions.

Some of the second memory cells may form a second cell array. In an implementation, the second cell array may include nine second memory cells, and sixteen second cell arrays may be spaced apart from each other in each of the first and second directions on the first region I of the substrate 100.

In an implementation, the first and second cell arrays may overlap each other in the third direction.

The fourth electrode 385, the second selection pattern 395, the fifth electrode 405, the second variable resistance pattern 415 and the sixth electrode 425 of the second memory cell may include the same materials as the first electrode 295, the first selection pattern 305, the second electrode 315, the first variable resistance pattern 325 and the third electrode 335, respectively, of the first memory cell.

In an implementation, the third conductive line 455 may extend in the first direction, and a plurality of third conductive lines 455 may be spaced apart from each other in the second direction.

In an implementation, the third conductive lines 455 may overlap the first conductive lines 275, respectively, in the third direction, and a length in the first direction of each of the third conductive lines 455 may be greater than a length in the first direction of each of the first conductive lines 275.

An eighth contact plug 446 may be formed under an end portion (in the first direction) of the third conductive line 455, and may contact an upper surface of the sixth contact plug 356 and a bottom surface of the third conductive line 455. In an implementation, a plurality of eighth contact plugs 446 may be spaced apart from each other in the second direction.

A ninth contact plug 448 may be formed at a portion of the first region I of the substrate 100 between an end portion (in the second direction) of the second conductive line 365 and the second region II of the substrate 100, and may contact an upper surface of the seventh contact plug 358. In an implementation, a plurality of ninth contact plugs 448 may be spaced apart from each other in the first direction.

In an implementation, each of the eighth and ninth contact plugs 446 and 448 may include tungsten.

Referring to FIGS. 22 to 24, processes substantially the same as or similar to those illustrated with reference to FIGS. 10 to 15 may be performed.

In an implementation, a seventh electrode 475, a third selection pattern 485 and a third memory unit sequentially stacked may be formed on the third conductive line 455, an eleventh insulating interlayer 520 may be formed on the tenth insulating interlayer 460 to cover sidewalls of the seventh electrode 475, the third selection pattern 485 and the third memory unit, and a fourth conductive line 545 and a twelfth insulating interlayer 550 covering a sidewall of the fourth conductive line 545 may be formed on the eleventh insulating interlayer 520 and the third memory unit. The third memory unit may include an eighth electrode 495, a third variable resistance pattern 505 and a ninth electrode 515 sequentially stacked.

The seventh electrode 475, the third selection pattern 485 and the third memory unit sequentially stacked may form a third memory cell, and a plurality of third memory cells may be spaced apart from each other in each of the first and second directions.

Some of the third memory cells may form a third cell array. In an implementation, the third cell array may include nine third memory cells, and sixteen third cell arrays may be spaced apart from each other in each of the first and second directions on the first region I of the substrate 100.

In an implementation, the first to third cell arrays may overlap each other in the third direction.

The seventh electrode 475, the third selection pattern 485, the eighth electrode 495, the third variable resistance pattern 505 and the ninth electrode 515 of the third memory cell may include the same materials as the first electrode 295, the first selection pattern 305, the second electrode 315, the first variable resistance pattern 325 and the third electrode 335, respectively, of the first memory cell.

In an implementation, the fourth conductive line 545 may extend in the second direction, and a plurality of fourth conductive lines 545 may be spaced apart from each other in the first direction.

In example embodiments, the fourth conductive lines 545 may overlap the second conductive lines 365, respectively, in the third direction, and a length (in the first direction) of each of the fourth conductive lines 545 may be greater than a length (in the first direction) of each of the second conductive lines 365.

A tenth contact plug 538 may be formed under an end portion (in the second direction) of the fourth conductive line 545, and may contact an upper surface of the seventh contact plug 356 and a bottom surface of the fourth conductive line 545. In an implementation, a plurality of tenth contact plugs 538 may be spaced apart from each other in the first direction.

In an implementation, the tenth contact plug 538 may include tungsten.

Processes substantially the same as or similar to those illustrated with reference to FIGS. 2 to 4 may be performed to complete the fabrication of the variable resistance memory device.

As described above, the sixth and eighth contact plugs 356 and 446 electrically connected to the third conductive line 455 and the seventh, ninth, and tenth contact plugs 358, 448 and 538 electrically connected to the fourth conductive line 455 among the contact plugs on the first region I of the substrate 100 may not include copper and may include tungsten. An electromigration (EM) phenomenon or an increase of bias temperature stress (BTS) may not occur in a structure including tungsten even if it has a small size, and the sixth to tenth contact plugs 356, 358, 466, 468 and 538 including tungsten may have a reduced size.

In an implementation, the sixth to tenth contact plugs 356, 358, 446, 448 and 538 may directly extend in the third direction on the first region I to be electrically connected to the third and fourth transistors without passing through the second region II of the substrate 100.

FIGS. 25 to 28 are plan views and cross-sectional views of variable resistance memory devices in accordance with example embodiments.

The variable resistance memory devices may be substantially the same as or similar to that illustrated with reference to FIGS. 22 to 24, except for some elements. Thus, like reference numerals refer to like elements, and repeated descriptions thereon may be omitted herein.

Figure 25:
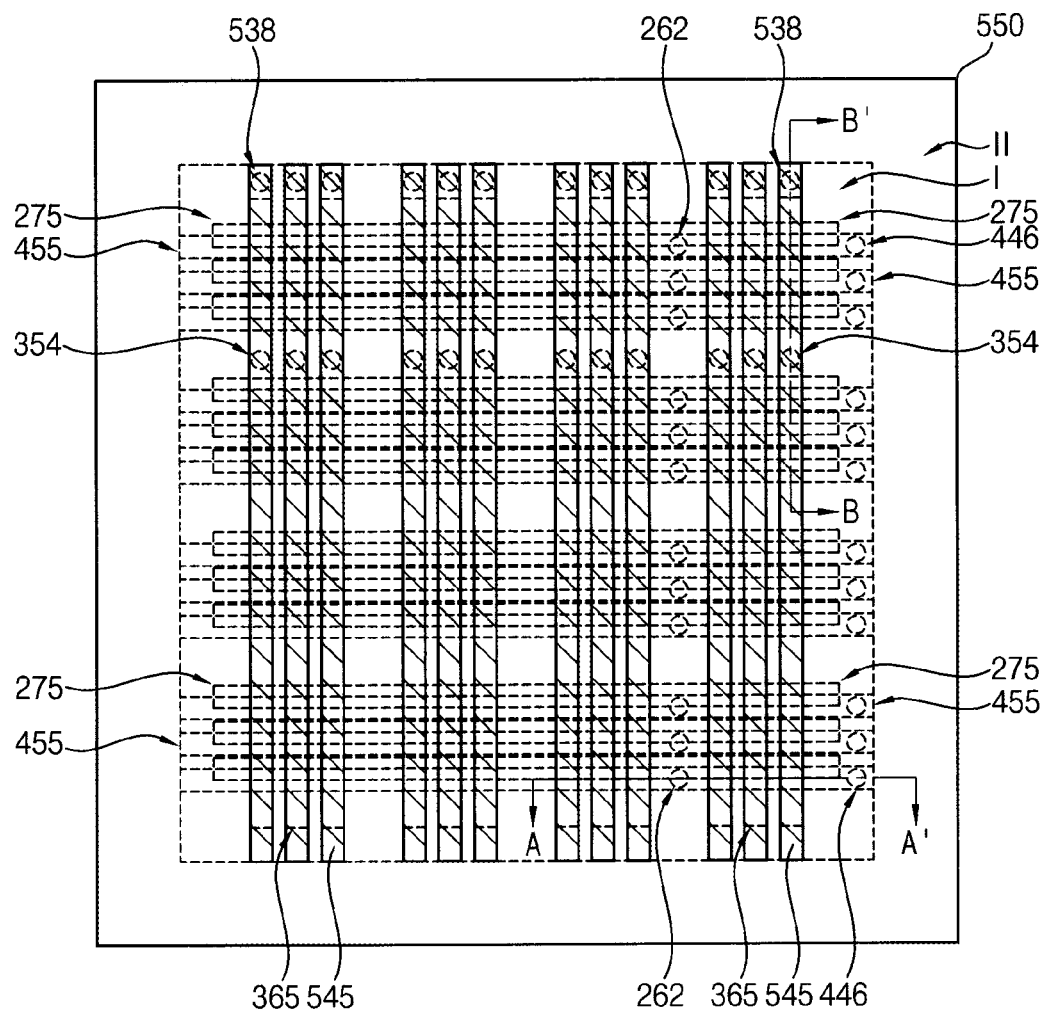
FIGS. 25 to 28 are plan views and cross-sectional views of variable resistance memory devices in accordance with example embodiments.
Figure 26:
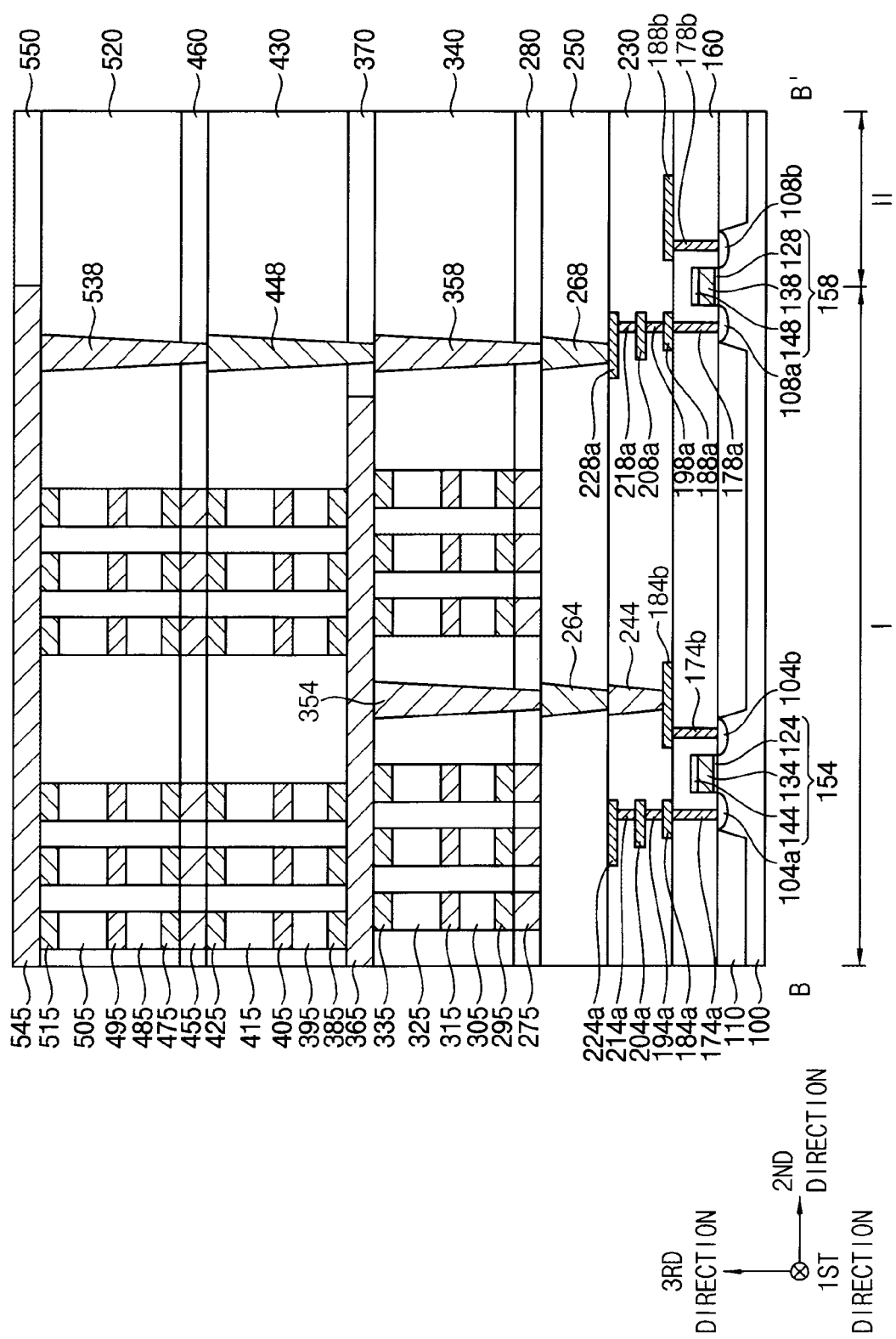

Referring to FIGS. 25 and 26, the third conductive line 455 may not entirely overlap the first conductive line 275 in the third direction, but rather may only partially overlap the first conductive line 275 in the third direction.

In an implementation, the second memory cells between the second and third conductive lines 365 and 455 and the first memory cells between the first and second conductive lines 275 and 365 may not entirely overlap each other in the third direction, but rather may only partially overlap each other in the third direction. The third memory cells between the third and fourth conductive lines 455 and 545 may entirely overlap the second memory cells in the third direction.

Figure 27:
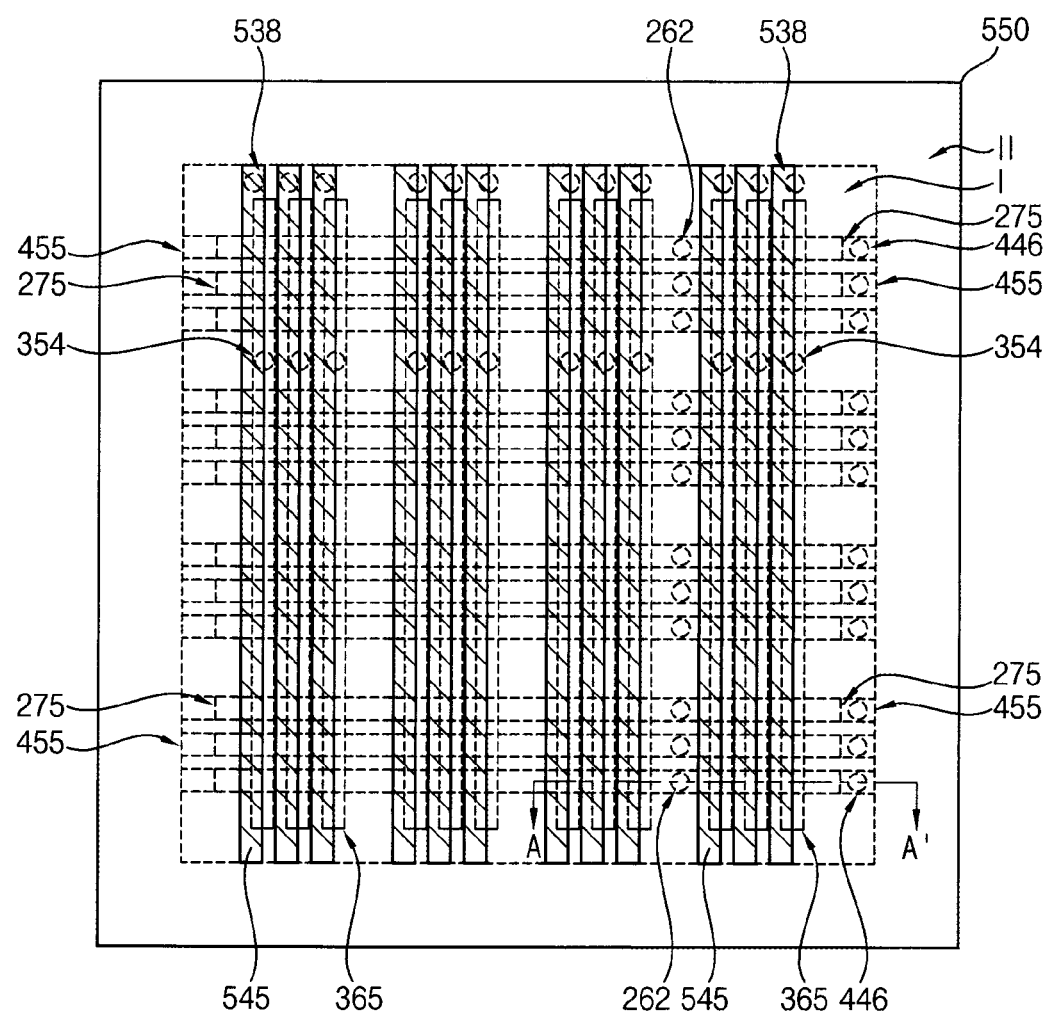
Figure 28:
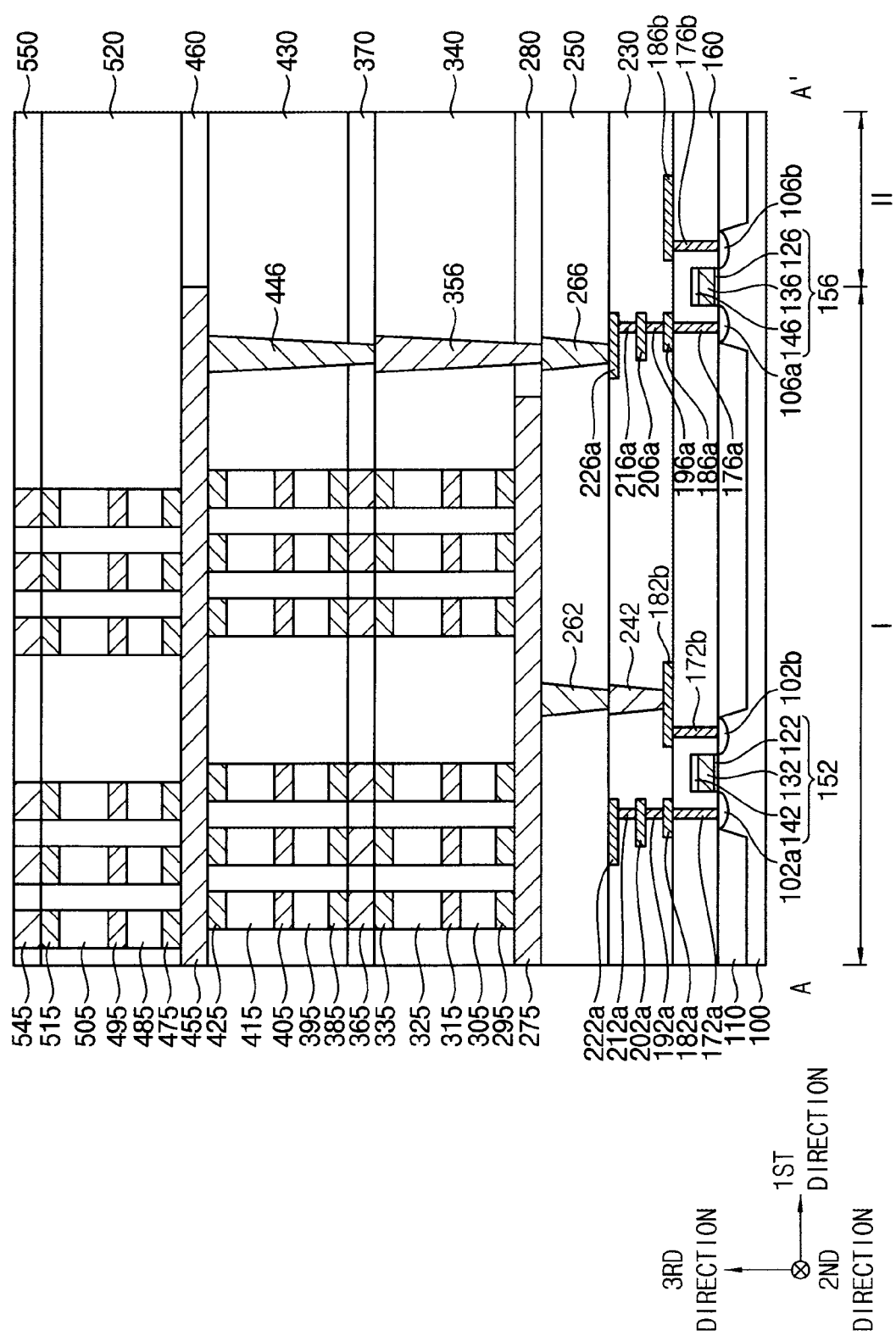

Referring to FIGS. 27 and 28, the fourth conductive line 545 may not entirely overlap the second conductive line 365 in the third direction, but rather may only partially overlap the second conductive line 365 in the third direction.

In an implementation, the third memory cells between the third and fourth conductive lines 455 and 545 and the second memory cells between the second and third conductive lines 365 and 455 may not entirely overlap each other in the third direction, but rather may only partially overlap each other in the third direction. The first memory cells between the first and second conductive lines 275 and 365 may entirely overlap the second memory cells in the third direction.

Figure 29:
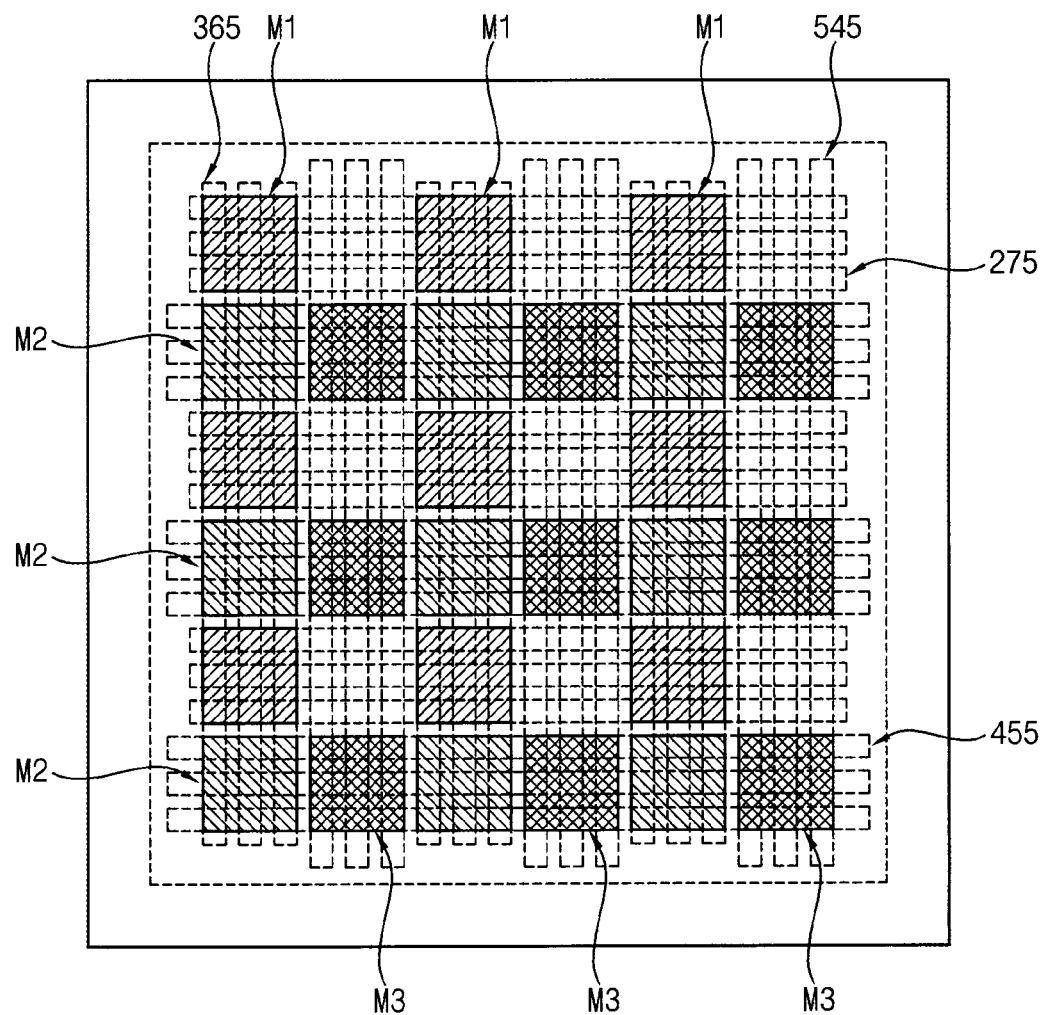
FIG. 29 is a plan view of a stage in a method of manufacturing a variable resistance memory device in accordance with example embodiments.

FIG. 29 is a plan view of a stage in a method of manufacturing a variable resistance memory device in accordance with example embodiments.

This variable resistance memory device may be substantially the same as or similar to those illustrated with reference to FIGS. 25 to 28. Thus, like reference numerals refer to like elements, and repeated descriptions thereon may be omitted herein.

Referring to FIG. 29, processes substantially the same as or similar to those illustrated with reference to FIGS. 5 to 15 and FIGS. 16 to 24 may be performed so that a variable resistance memory device similar to those of FIGS. 25 to 28 may be manufactured.

In an implementation, the first and third conductive lines 275 and 455 may not overlap each other in the third direction, and the second and fourth conductive lines 365 and 545 may not overlap each other in the third direction. In an implementation, the first cell array including the first memory cells between the first and second conductive lines 275 and 365, the second cell array including the second memory cells between the second and third conductive lines 365 and 455, and the third cell array including the third memory cells between the third and fourth conductive lines 455 and 545 may not overlap one another in the third direction. In an implementation, a plurality of first cell arrays may be spaced apart from each other in each other first and second directions, a plurality of second cell arrays may be spaced apart from each other in each of the first and second directions, and a plurality of third cell arrays may be spaced apart from each other in each of the first and second directions.

In an implementation, an area where the first cell arrays are formed on the first region I of the substrate 100 may be referred to as a first memory block M1, an area where the second cell arrays are formed on the first region I of the substrate 100 may be referred to as a second memory block M2, and an area where the third cell arrays are formed on the first region I of the substrate 100 may be referred to as a third memory block M3.

In an implementation, the first contact plug 262 directly contacting the bottom surface of the first conductive line 275 among the contact plugs on the first region I of the substrate 100 may be at any location regardless of the first to third memory blocks M1, M2 and M3. In an implementation, the first contact plug 262 may be within the first to third memory blocks M1, M2 and M3 on the first region I of the substrate 100. In an implementation, the first contact plug 262 may be at an outside of the first to third memory blocks M1, M2 and M3 on the first region I of the substrate 100.

In an implementation, the third contact plug 354 directly contacting the bottom surface of the second conductive line 365 among the contact plugs on the first region I of the substrate 100 may be at an outside of the first memory block M1 on the first region I of the substrate 100. In an implementation, the third contact plug 354 may be within the second and third memory blocks M2 and M3 on the first region I of the substrate 100. In an implementation, the third contact plug 354 may be at an outside of the second and third memory blocks M2 and M3 on the first region I of the substrate 100.

In an implementation, the eighth contact plug 446 directly contacting the bottom surface of the third conductive line 455 among the contact plugs on the first region I of the substrate 100 may be at an outside of the first and second memory blocks M1 and M2 on the first region I of the substrate 100. In an implementation, the eighth contact plug 446 may be within the third memory block M3 on the first region I of the substrate 100. In an implementation, the eighth contact plug 446 may be at an outside of the third memory block M3 on the first region I of the substrate 100.

In an implementation, the tenth contact plug 538 directly contacting the bottom surface of the fourth conductive line 545 among the contact plugs on the first region I of the substrate 100 may be at an outside of the first to third memory blocks M1, M2 and M3 on the first region I of the substrate 100.

As described above, the variable resistance memory device manufactured by the above method may include the first, third, eighth and tenth contact plugs 262, 354, 466 and 545 directly contacting the first to fourth conductive lines 275, 365, 455 and 545, respectively. In an implementation, the first, third, eighth and tenth contact plugs 262, 354, 466 and 545 may be electrically connected to the first, second, fourth and fifth transistors, respectively, without extending through the second region II of the substrate 100.

By way of summation and review, if contact plugs have a size less than a given value, an electromigration (EM) phenomenon, an increase of bias temperature stress (BTS), or the like could occur.

One or more embodiments may provide a variable resistance memory device having a contact plug.

One or more embodiments may provide a variable resistance memory device having improved electrical characteristics.

In a method of manufacturing the variable resistance memory device in accordance with example embodiments, the contact plugs may include tungsten, and an EM phenomenon and increase of BTS may be reduced. Additionally, the contact plugs may have reduced sizes, and may directly extend in the vertical direction to be electrically connected to the transistors on the cell region of the substrate without extending through the peripheral circuit region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
 a substrate including a cell region and a peripheral circuit region surrounding the cell region;
 first transistors and second transistors on the cell region of the substrate;
 first conductive lines on the first and second transistors on the cell region of the substrate, each of the first conductive lines extending in a first direction parallel to an upper surface of the substrate, and the first conductive lines being spaced apart from each other in a second direction parallel to the upper surface of the substrate and crossing the first direction;
 first contact plugs directly contacting substrate-facing surfaces of the first conductive lines and extending in a third direction perpendicular to the upper surface of the substrate, the first contact plugs being electrically connected to the first transistors, respectively;
 second conductive lines on the first conductive lines on the cell region of the substrate, each of the second conductive lines extending in the second direction, and the second conductive lines being spaced apart from each other in the first direction;
 second contact plugs directly contacting substrate-facing surfaces of the second conductive lines and extending in the third direction, the second contact plugs being electrically connected to the second transistors, respectively; and
 memory units between the first and second conductive lines, the memory units being at an area where the first and second conductive lines overlap each other in the third direction,
 wherein each of the second contact plugs does not overlap with any of the memory units in the third direction.

2. The variable resistance memory device as claimed in claim 1, wherein each of the second contact plugs extends from the substrate-facing surface of a corresponding one of the second conductive lines to at least a level of a substrate-facing surface of a corresponding one of the first conductive lines.

3. The variable resistance memory device as claimed in claim 1, wherein each of the second contact plugs includes tungsten.

4. The variable resistance memory device as claimed in claim 1, further comprising lower contact plugs and lower wirings alternately stacked, the lower contact plugs and the lower wirings being electrically connected to each of the second transistors and connected to each of the second contact plugs.

5. The variable resistance memory device as claimed in claim 4, wherein at least one of the lower contact plugs and the lower wirings includes copper.

6. The variable resistance memory device as claimed in claim 1, wherein each of the first contact plugs overlaps with at least one of the memory units in the third direction.

7. The variable resistance memory device as claimed in claim 1, further comprising a conductive structure on the peripheral circuit region of the substrate, the conductive structure not overlapping any of the memory units in the third direction.

8. The variable resistance memory device as claimed in claim 1, wherein each of the first contact plugs includes tungsten.

9. The variable resistance memory device as claimed in claim 1, further comprising lower contact plugs and lower wirings alternately stacked, the lower contact plugs and lower wirings being electrically connected to each of the first transistors and connected to each of the first contact plugs.

10. The variable resistance memory device as claimed in claim 9, wherein at least one of the lower contact plugs and the lower wirings includes copper.

11. The variable resistance memory device as claimed in claim 1, further comprising:
 a third transistor; and
 an upper wiring on the second conductive lines on the cell region and the peripheral circuit region of the substrate, the upper wiring being electrically connected to the third transistor.

12. The variable resistance memory device as claimed in claim 11, further comprising a conductive structure between the third transistor and the upper wiring, the conductive structure being electrically connected to the third transistor and the upper wiring, and the conductive structure including copper.

13. The variable resistance memory device as claimed in claim 1, wherein each of the memory units includes a first electrode, a variable resistance pattern, and a second electrode sequentially stacked.

14. The variable resistance memory device as claimed in claim 13, further comprising a third electrode and a selection pattern between each of the first conductive lines and the first electrode.

15. A variable resistance memory device, comprising:
 a substrate including a cell region and a peripheral circuit region surrounding the cell region;
 transistors on the cell region of the substrate;
 first to fourth conductive lines spaced apart from each other in a vertical direction on the cell region of the substrate, the vertical direction being perpendicular to an upper surface of the substrate;
 first to fourth contact plugs contacting substrate-facing surfaces of the first to fourth conductive lines, respectively, each of the first to fourth contact plugs extending in the vertical direction, and the first to fourth contact plugs being electrically connected to corresponding ones of the transistors, respectively;

first memory units between the first and second conductive lines, the first memory units being at an area where the first and second conductive lines overlap each other in the vertical direction, each of the first memory units including a first variable resistance pattern;

second memory units between the second and third conductive lines, the second memory units being at an area where the second and third conductive lines overlap each other in the vertical direction, each of the second memory units including a second variable resistance pattern; and third memory units between the third and fourth conductive lines, the third memory units being at an area where the third and fourth conductive lines overlap each other in the vertical direction, each of the third memory units including a third variable resistance pattern, wherein:

each of the first and third conductive lines extends in a first direction parallel to the upper surface of the substrate, the first and third conductive lines being spaced apart from each other in a second direction parallel to the upper surface of the substrate and crossing the first direction, and the first conductive lines not overlapping the third conductive lines in the vertical direction, each of the second and fourth conductive lines extends in the second direction, the second and fourth conductive lines being spaced apart from each other in the first direction, and the second conductive lines not overlapping the fourth conductive lines in the vertical direction, and each of the second contact plugs does not overlap any of the first memory units in the vertical direction.

16. The variable resistance memory device as claimed in claim 15, wherein each of the third contact plugs does not overlap any of the first and second memory units in the vertical direction.

17. The variable resistance memory device as claimed in claim 15, wherein each of the fourth contact plugs does not overlap any of the first to third memory units in the vertical direction.

18. The variable resistance memory device as claimed in claim 15, further comprising lower contact plugs and lower wirings alternately stacked in the vertical direction, the lower contact plugs and the lower wirings being electrically connected to each of the second to fourth transistors and connected to a corresponding one of the second to fourth contact plugs.

19. A variable resistance memory device, comprising:
a substrate including a cell region and a peripheral circuit region surrounding the cell region;
first transistors on the cell region of the substrate;
a second transistor on the peripheral circuit region of the substrate;
first to fourth conductive lines spaced apart from each other in a vertical direction on the cell region of the substrate, the vertical direction being perpendicular to an upper surface of the substrate;
an upper wiring on the fourth conductive lines on the cell region and the peripheral circuit region of the substrate;
first to fourth contact plugs contacting substrate-facing surfaces of the first to fourth conductive lines, respectively, the first to fourth contact plugs being electrically connected to corresponding ones of the transistors, respectively;
a conductive structure between the second transistor and the upper wiring, the conductive structure being electrically connected to the second transistor and the upper wiring;
first memory units between the first and second conductive lines, the first memory units being at an area where the first and second conductive lines overlap each other in the vertical direction, each of the first memory units including a first variable resistance pattern;
second memory units between the second and third conductive lines, the second memory units being at an area where the second and third conductive lines overlap each other in the vertical direction, each of the second memory units including a second variable resistance pattern; and
third memory units between the third and fourth conductive lines, the third memory units being at an area where the third and fourth conductive lines overlap each other in the vertical direction, each of the third memory units including a third variable resistance pattern, wherein:
each of the first and third conductive lines extends in a first direction parallel to the upper surface of the substrate, the first and third conductive lines being respectively spaced apart from each other in a second direction parallel to the upper surface of the substrate and crossing the first direction, and the first conductive lines not overlapping the third conductive lines in the vertical direction,
each of the second and fourth conductive lines extends in the second direction, the second and fourth conductive lines being respectively spaced apart from each other in the first direction, and the second conductive lines not overlapping the fourth conductive lines in the vertical direction, and
each of the second contact plugs does not overlap any of the first memory units in the vertical direction.

20. The variable resistance memory device as claimed in claim 19, further comprising lower contact plugs and lower wirings alternately stacked in the vertical direction, the lower contact plugs and the lower wirings being electrically connected to each of the second to fourth transistors and connected to a corresponding one of the second to fourth contact plugs.

* * * * *